US012337301B2

(12) United States Patent
Lashmore et al.

(10) Patent No.: US 12,337,301 B2
(45) Date of Patent: Jun. 24, 2025

(54) IRON NANOPARTICLES AND METHODS OF PRODUCTION

(71) Applicant: University of New Hampshire, Durham, NH (US)

(72) Inventors: David S. Lashmore, Lebanon, NH (US); Tyler Bennett, Durham, NH (US)

(73) Assignee: University of New Hampshire, Durham, NH (US)

( * ) Notice: Subject to any disclaimer, the term of this patent is extended or adjusted under 35 U.S.C. 154(b) by 448 days.

(21) Appl. No.: 17/214,161

(22) Filed: Mar. 26, 2021

(65) Prior Publication Data

US 2021/0213427 A1    Jul. 15, 2021

Related U.S. Application Data

(62) Division of application No. 15/693,992, filed on Sep. 1, 2017, now abandoned.

(Continued)

(51) Int. Cl.
*B01J 23/745* (2006.01)
*B01J 35/00* (2024.01)
(Continued)

(52) U.S. Cl.
CPC ............. *B01J 23/745* (2013.01); *B01J 35/23* (2024.01); *B01J 35/30* (2024.01); *B01J 35/393* (2024.01); *B01J 35/40* (2024.01); *B01J 37/0221* (2013.01); *B01J 37/16* (2013.01); *C01B 21/064* (2013.01); *C01B 32/162* (2017.08); *C23C 16/26* (2013.01); *B82Y 40/00* (2013.01); *Y10S 977/742* (2013.01);

(Continued)

(58) Field of Classification Search
None
See application file for complete search history.

(56) References Cited

U.S. PATENT DOCUMENTS

2008/0041270 A1\* 2/2008 Lee .................. B22F 1/054
106/31.92
2010/0034725 A1\* 2/2010 Harutyunyan ......... B82Y 40/00
977/750

(Continued)

OTHER PUBLICATIONS

Ago (J. Phys. Chem. B 2001, 105, 43, 10453-10456) (Year: 2001).*

(Continued)

*Primary Examiner* — Alexander M Weddle
(74) *Attorney, Agent, or Firm* — Finch & Maloney PLLC

(57) ABSTRACT

Techniques and methods are disclosed for producing a plurality of nanoparticles that can be used as catalysts to grow carbon or boron nitride nanotubes. The method includes mixing an iron salt including a ferrous or ferric ion with a long chain amine, thiol or polyphenol in a solvent comprising alcohol to produce a solution. Ferric or ferrous ion is reduced to zero valence iron. Nucleation of iron nanoparticles is initialized. The iron nanoparticles are capped to retard nanoparticle growth. The nanoparticles include an elemental iron core coated with a polyphenol that isolates the core from oxygen. The nanoparticles include an average diameter of less than or equal to 15.8 nanometers. The iron core may further include a secondary metal to form an iron-alloy. The secondary metal, in some applications, can be a transition metal.

23 Claims, 25 Drawing Sheets

Related U.S. Application Data

(60) Provisional application No. 62/382,637, filed on Sep. 1, 2016.

(51) Int. Cl.
| | |
|---|---|
| *B01J 35/02* | (2006.01) |
| *B01J 35/23* | (2024.01) |
| *B01J 35/30* | (2024.01) |
| *B01J 35/40* | (2024.01) |
| *B01J 37/02* | (2006.01) |
| *B01J 37/16* | (2006.01) |
| *C01B 21/064* | (2006.01) |
| *C01B 32/162* | (2017.01) |
| *C23C 16/26* | (2006.01) |
| *B82Y 40/00* | (2011.01) |

(52) U.S. Cl.
CPC ........ *Y10S 977/843* (2013.01); *Y10S 977/891* (2013.01)

(56) References Cited

U.S. PATENT DOCUMENTS

| | | |
|---|---|---|
| 2010/0200501 A1 | 8/2010 | Hoag et al. |
| 2013/0309473 A1* | 11/2013 | Sundaram .............. B01J 37/086 |
| | | 428/338 |
| 2015/0204444 A1* | 7/2015 | Sui .......................... F16J 15/00 |
| | | 156/247 |
| 2018/0056279 A1 | 3/2018 | Lashmore et al. |

OTHER PUBLICATIONS

Chang, C. et al., "Simultaneous adsorption and degradation of y-HCH by nZVI/Cu bimetallic nanoparticles with activated carbon support," 159 Environmental Pollution, pp. 2507-2514 (2011).

Hoag, G. et al., "Degradation of bromothymol blue by 'greener' nano-scale zero-valent iron synthesized using tea polyphenols," 19 J. Mater. Chem., pp. 8671-8677 (2009).

Sanna, V. et al., "Targeted Biocompatible Nanoparticles for the Delivery of (-)-Epigallocatechin 3-Gallate to Prostate Cancer Cells," 54 J. Med. Chem., pp. 1321-1332 (2011).

* cited by examiner

IRON NANOPARTICLES AND METHODS OF PRODUCTION

CROSS-REFERENCE TO RELATED APPLICATIONS

This application is a divisional of U.S. patent application Ser. No. 15/693,992, filed on Sep. 1, 2017, titled IRON NANOPARTICLES AND METHODS OF PRODUCTION, and which claims the benefit of U.S. Provisional Patent Application No. 62/382,637, filed on Sep. 1, 2016, the contents of which are herein incorporated by reference in their entireties.

FIELD OF THE DISCLOSURE

This disclosure relates to nanoparticles, and more particularly to iron nanoparticle catalysts for production of nanotubes.

BACKGROUND

Metal nanoparticles can be used as catalysts for a variety of chemical processes, including the production of carbon or boron nitride nanotubes. Metallic nanoparticles may also function as catalysts for the Fisher Trope Process, where carbon monoxide is transformed into hydrocarbons, for drug attachment, and for delivering drugs to the body where magnetic fields can assist particle motion and insure accurate placement.

SUMMARY

One example embodiment of the present disclosure provides a plurality of nanoparticles, each nanoparticle including an elemental iron core coated with a polyphenol that isolates the core from oxygen, the plurality of nanoparticles having an average diameter of less than or equal to 50 nanometers. In some cases, the nanoparticles have an average diameter within a range from 5 to 25 nm. In other cases, the nanoparticles have an average diameter of 15.8 nm. In some cases, the polyphenol is one of epigallocatechin gallate, epicatechin, epigallocatechin, and gallocatechin. In other cases, the elemental iron core further includes a secondary metal to form an iron-alloy. In some such cases, the secondary metal is a transition metal. In some other cases, the nanoparticles have an average diameter of less than or equal to 8.5 nm. In some cases, the nanoparticles have an average diameter of less than 10 nm with a standard deviation of less than 3 nm. In other cases, the nanoparticles have an average diameter within a range from 5 to 25 nm and a standard deviation within a range from 1 to 4 nm. In yet some other cases, the nanoparticles have a face centered cubic (FFC) crystalline structure.

Another example embodiment of the present disclosure provides a suspension of iron nanoparticles including a plurality of independent, non-agglomerated iron nanoparticles, the nanoparticles comprising elemental iron and having an average diameter of less than 50 nm. In some cases, the iron nanoparticles are suspended in an alcohol. In other cases, the nanoparticle diameter distribution has a standard deviation of less than 3 nm. In some other cases, the nanoparticle diameter distribution has a standard deviation within a range from 1 to 3 nm. In some cases, the iron nanoparticles include a polyphenol coating. In some such cases, the polyphenol is present in the suspension at a concentration of less than 1.5 g/L. In other cases, the polyphenol is present in the suspension at a concentration within a range of 0.5 to 1.5 g/L. In some cases, the nanoparticles further comprise copper. In some other cases, the nanoparticles have an average diameter of less than or equal to 6.1 nm. In some such cases, the nanoparticles include copper and have a diameter distribution that has a standard deviation of less than 1 nm.

Another example embodiment of the present disclosure provides a method of producing iron nanoparticles, the method including mixing an iron salt comprising a ferrous or ferric ion with a long chain amine, thiol or polyphenol in a solvent comprising alcohol to produce a solution; reducing the ferric or ferrous ion to zero valence iron; initializing nucleation of iron nanoparticles; and capping the iron nanoparticles to retard nanoparticle growth. In some cases, the alcohol comprises at least one of methanol and ethanol. In other cases, the iron nanoparticles have an average diameter of less than or equal to 50 nm. In some such cases, the diameter distribution of the iron nanoparticles has a standard deviation of less than or equal to 3.7 nm. In other cases, the diameter distribution of the iron nanoparticles has a standard deviation within a range from 1 to 3 nm. In some cases, the solution comprises iron at a concentration of less than or equal to 2.5 g/L. In other cases, the solution comprises iron at a concentration within a range from 0.1 to 2.5 g/L. In yet other cases, the solution includes polyphenol at a concentration of less than or equal to 1.5 g/L. In some other cases, the solution includes iron at a concentration of greater than or equal to 0.5 g/L. In other cases, the long chain amine, thiol or polyphenol is a polyphenol. In some such cases, the polyphenol is selected from epigallocatechin gallate, epicatechin, epigallocatechin, and gallocatechin. In other cases, the method further includes adding copper to the solution to produce iron nanoparticles comprising copper. In some other cases, the nanoparticles have an average diameter of less than or equal to 15.8 nm. In some cases, the nanoparticles have an average diameter within a range from 5 to 25 nm. In yet other cases, the nanoparticles have an average diameter of less than or equal to 5.8 nm.

Another example embodiment of the present disclosure provides a method of producing a nanotube, the method includes providing a plurality of nanoparticles to a furnace, the nanoparticles comprising an elemental iron core coated with a polyphenol that isolates the core from oxygen, the nanoparticles having an average diameter of less than or equal to 50 nanometers; removing the polyphenol from the plurality of nanoparticles to expose an iron surface of the nanoparticles; and catalyzing nanotube growth on the exposed surface of the nanoparticles. In some cases, the plurality of nanoparticles is delivered to the furnace via an alcoholic suspension. In other cases, the plurality of nanoparticles is deposited onto a substrate prior to the nanoparticles being provided to the furnace. In some cases, the nanotubes are carbon nanotubes. In yet other cases, the nanotubes are boron nitride nanotubes. In some cases, the nanoparticles have an average diameter of less than 6.2 nm. In some other cases, the nanoparticles have an average diameter within a range from 5 to 25. In yet other cases, the nanoparticles have an average diameter of 15 nm.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

Figure 1:
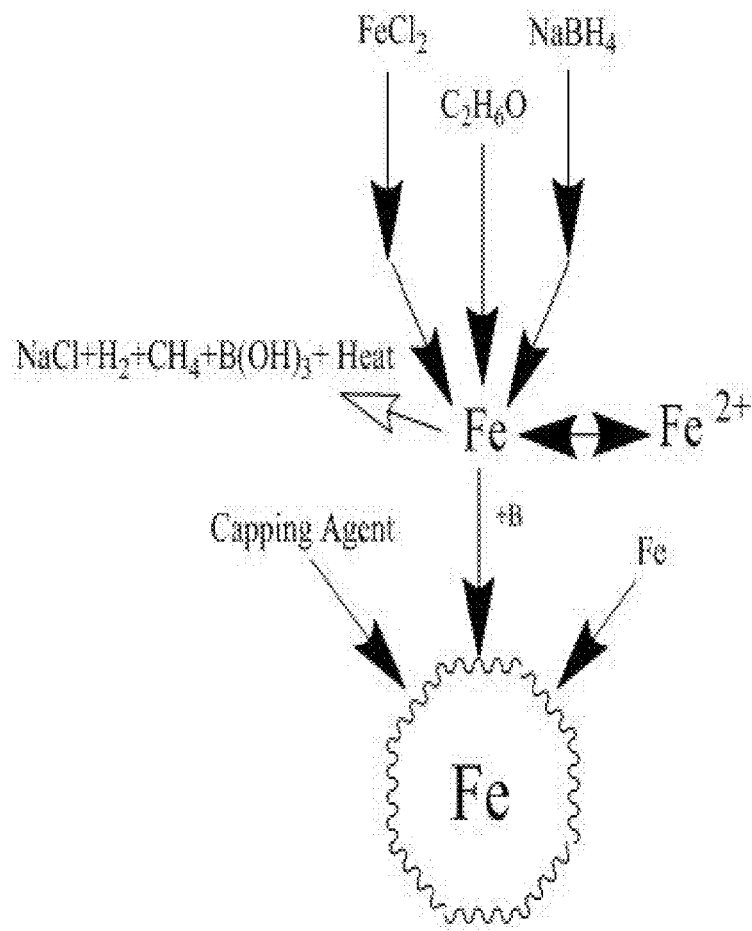
FIG. 1 is a schematic diagram of a reaction of FeCl2 and NaBH4 in ethanol to form iron nanoparticles, in accordance with an embodiment of the present disclosure.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

Techniques and methods are disclosed for producing a plurality of iron nanoparticles that can be used as catalysts to grow carbon and boron nitride nanotubes. In one example, the method can include mixing an iron salt including a ferrous or ferric ion with a long chain amine, thiol or polyphenol in a solvent comprising alcohol to produce a solution. Ferric or ferrous ion of the solution can be reduced to zero valence iron. Nucleation of iron nanoparticles is initialized to produce the particles. The produced nanoparticles can be iron nanoparticles that include an elemental iron core coated with a polyphenol. The polyphenol coating isolates the core of the iron nanoparticle to prevent the particle from reacting with oxygen present in the air of the surrounding environment. The nanoparticles include an average diameter of less than or equal to 15.8 nanometers, and thus are a suitable size for use as a catalyst to grow carbon or boron nitride nanotubes. In some examples, the iron core may further include a secondary metal (e.g., a transition metal, such as copper) to form an iron-alloy. The secondary metal reduces the size of the nanoparticles so that the particles are properly sized to grow nanotubes such as carbon nanotubes or boron nitride nanotubes.

General Overview

To grow nanotubes, most processes require a catalyst. The catalyst can be a nanoparticle made of a transition metal (e.g., iron, nickel or cobalt) or an alloy thereof. In some instances, the catalyst can also be more exotic and expensive transition metals (e.g., ruthenium, rhodium, palladium, gold, and silver) and non-transition metals (e.g., magnesium, boron, and silicon). Other metals, such as cobalt and nickel, can also be used as a catalyst, but these metals are potentially mutagenic. The catalyst is typically placed into a reaction chamber in which to grow the nanotubes. Thermal energy can be applied to the chamber to reduce the catalyst to an elemental state to support nanotube growth. In one example, nanotubes can be produced by heating ferrocene within a reaction chamber to reduce the ferrocene to iron nanoparticles on which nanotubes can grow. Thus, the catalyst and nanotube are produced together within the reaction chamber.

Nanoparticle synthesis has garnered attention for technological applications, such as industrial processing and biomedical applications (e.g., cancer treatments). The size ranges of particles for these applications are in the nanostructural domain. Pure iron nanoparticles have been of particular interest for their reactivity and relative biological inertness. Unfortunately, pure iron nanoparticles are difficult to manufacture outside a reaction chamber because oxide forms on the surface of the iron nanoparticles when the particles are exposed to air. In addition, iron nanoparticles also clump together over time to form larger particles that are not suitable for nanotube production.

Thus, and in accordance with an embodiment of the present disclosure, techniques and methods are disclosed for producing synthesized iron nanoparticles that are suitable for nanotube production (e.g., boron nitride and CNT continuous yarn). In particular, the iron nanoparticles can have a diameter suitable to grow nanotubes in a system, for example a catalyst chemical vapor deposition (CVD) system. Furthermore, the produced nanoparticles can have a narrow size distribution. The nanoparticles can also include a polyphenol coating that prevents the particles from reacting with air in the environment. Thus, polyphenol coated iron nanoparticles can be produced separately from nanotubes (e.g., the particles can be produced outside a reaction chamber in which the nanotubes are grown). In some examples, the nanoparticles can include a secondary metal, such as copper, to reduce nanoparticle size.

To produce nanotubes from nanoparticles, the nanoparticles can be substantially mono-modal in diameter distribution. In one example, the nanoparticles can be sub-10 nm diameter size iron nanoparticles, with a narrow size distribution. The small size of the nanoparticles causes the particles to experience a large amount of internal pressure that can affect the particle's crystal structure. Thus, internal pressure of the nanoparticle is related to particle size, as expressed using the Young-Laplace Equation, $(\Delta P=2\gamma/r)$ where the smaller the particle radius "$r$" the higher the internal pressure, "$\gamma$" is the surface energy. Synthesis techniques control the particle size distribution. On the nanoscale characterization, handling and surface purity are particularly important processes as the surface is sensitive to contamination. This is especially true for nanoparticles that form an oxide in air. Oxidation is enhanced by the small particle radius because there is an increased surface area for the smaller particles on which oxygen can form a bond.

In some cases, a capping agent can be included in a solution to create nanoparticles. Capping agents, such as anionic surfactants and large chain amines (e.g., dodecylamine and hexadecylamine), can limit the size of the nanoparticle by inhibiting nanoparticle growth. Many naturally occurring compounds, such as polyphenols, can be used as a capping agent. Solutions that include capping agents can produce nanoparticles having a size on the order of single nanometers.

It has been found that the concentration of iron used can have an effect on the particle size. Increasing the concentration of iron within the reaction media produces smaller nanoparticles, (e.g., particle size was reduced from 5.95 nm to 5.76 nm) along with a decrease in the standard deviation (e.g., from 1.83 nm to 1.23 nm).

X-ray diffraction is useful in determining the phase of the iron that comprises the nanoparticles. The x-ray spectra show that iron is present, but that it is in a distorted Face Centered Cubic (FCC) phase, believed to be caused by carbon impurities in the polyphenols. The lattice distortion resulted in a growth of crystal in the x-direction, but a reduction of crystalline growth in the y-direction. Crystalline growth in the z-direction remained constant. Thus, crystalline growth of the iron nanoparticles indicated that the impurities were present on the octahedral sites of the iron crystals (e.g., on any edge that was parallel to the x-axis). When the sample is annealed at 250° C., small peaks of body centered cubic (BCC) iron and iron oxide were observed. The fact that iron oxide was not present prior to annealing indicates that the iron nanoparticles are coated by the polyphenols. The polyphenol coating isolates the nanoparticles from oxygen in the environment and thereby allowing the particles to be more stable in air. In addition, the polyphenol coated nanoparticles exhibit an icosahedral or decahedral shape caused by crystal twinning that occurs at room temperature.

Applications of Nanoparticles

Nanoparticles can be used in a variety of applications, including biomedical applications and in the production of carbon and boron nitride nanotubes. The production of fixed chirality or fixed diameter nanotubes, however, has proven elusive. Because of the nanotubes' variation in physical and electrical properties based on the diameter of the nanotubes, the use of nanotubes is limited for some applications, such as in semi-conductors or as a replacement for copper wiring. By using nanoparticles as a catalyst for nanotubes, one can measure the diameter distribution of the catalysts prior to growth and predict the diameter of nanotubes grown from the catalyst.

Nanoparticles can also be used in solder applications, particularly for multilayer circuit applications. In such applications, different diameters of solder particles can be formed, like those currently made with tin, which have different melting temperatures. The melting point for each particle depends on its size. Thus, different melting point solders can be made so that each successive layer has a lower melting point than the layer beneath it, so that electronics can be manufactured in steps without affecting a subsequent layer. Additionally, once the lead-free solder melts, it will have bulk melting point properties. In addition, the melted solder can form a uniform composition, thereby minimizing galvanic corrosion. The uniform composition of solder reduces the environmental impact of electronics by removing lead as a component and can improve electrical conductivity. In addition, solder failure often occurs at the embrittled interface of the solder and copper substrate due to poor bonding of the two materials. The approach of using small diameters of more stable solders eliminates this problem.

Nanoparticle Size Control

For industrial applications such as nanotube production, the size of the nanoparticles and the consistency of the size of the nanoparticles are important considerations. For example, the ratio of the diameter of a nanoparticle to the diameter of a resulting nanotube can be, for example, between 1/0.7 and 1/0.9. The band gap of the nanotube is related to the inverse of the nanotube diameter. The nanotube diameter also affects its electrical properties. Oxides readily form on the surface of almost all metals, which can increase the size of these nanoparticles. It can also change the usefulness of the nanoparticles as the surface will react differently in comparison with the non-oxide metal surface. The rates of oxidation of nanoparticles can be very high due to, for example, thermal effects and high surface area. Reactions with other species such as hydroxide, sulfur and nitrogen can also occur. While the oxygen and other impurities can be removed by other means later in the process, it may limit the use of the nanoparticles in some applications. For example, in non-forest nanotube growth, where time is a factor for growth, there may not be sufficient time to reduce the iron-oxide nanoparticles to the metallic state, which is required for catalytic activity.

One technique to help limit the size of the nanoparticles is to add in a secondary metal to the nanoparticle. When these nanoparticles are formed, the secondary metal will diffuse into the primary metal and often form an alloy. The secondary metal will increase the number of defects in the nanocrystal which may make it more energetically favorable to form new nanoparticles than to continue growing. The relative size distribution of the nanoparticles produced using a secondary metal, however, may expand, and the chemical properties of the nanoparticles may also be altered. Additionally, large amounts of a secondary metal can increase the diameter of the nanoparticles.

In some applications, the magnetic and energetic properties of the nanoparticles cause them to cluster together to form macrostructures. These agglomerations are time dependent. Over a given period of time, these nanoparticles may lose their spherical structure and form crystalline, bulk like structures. To avoid the risks of agglomerated nanoparticles, an ionic surfactant can be added to the solution used to produce the nanoparticles. The surfactant binds to the nanoparticle and repels like coated particles. Although the ionic surfactant prevents the nanoparticles from clumping, it also causes a similar problem to that which is found with oxidation. The removal of the surfactant from the surface of the nanoparticles takes time, which can limit the usefulness of the nanoparticles in specific applications.

In some examples, capping agents, such as long chain carbon molecules, can be added to the solution to maintain a uniform size distribution of small nanoparticles. Appropriate capping agents include, for example, a long chain amine, thiol, or polyphenol. These long chain carbon molecules, such as hexadecylamine or octadecylamine, bind to the surface of the iron nanoparticles at locations where other iron atoms could attach to the particles. By preventing the attachment of nanoparticles to each other, particle growth is reduced and the iron cores remain separate from each other. In addition, the long chain carbon molecules repel each other, and thus limit or otherwise eliminate iron nanoparticle conglomerations. In some examples, the nanoparticles can be capped iron-platinum particles having a size of, for example, 5±2 nm, or 7±1 nm.

Iron Nanoparticles—Reducing Agents and Solvents

FIG. 1 is a schematic diagram illustrating the reduction of ferrous ion ($FeCl_2$) with $NaBH_4$ in ethanol to form iron nanoparticles, in accordance with an embodiment of the present disclosure. The reaction proceeds as shown in equation 1 provided below.

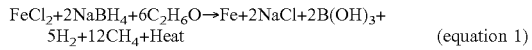  (equation 1)

In some examples, iron can change state between the Fe0 and Fe2+, as shown by the double arrow in FIG. 1. To limit nanoparticle growth, a capping agent is applied to the nanoparticle (as indicated by the serrated like boundaries shown in FIG. 1).

Alcohols such as ethanol can be used as a solvent to grow nanoparticles. Ethanol can solubilize a variety of metal salts and reacts with a reducing agent such as sodium borohydride at a slower rate than water. Thus, nanoparticles in the solvent can remain reduced in size for a longer period of time even if the system is exposed to oxygen. Additionally, ethanol is a fuel source for growing carbon nanotubes and thus can serve the dual purpose of providing a solvent for iron reduction and a fuel source for carbon nanotubes. Ethanol reacts with sodium borohydride in the following reaction:

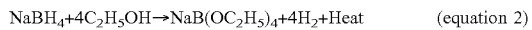  (equation 2)

In other examples, alcohols such as butanol and methanol can be used as a solvent to grow metallic nanoparticles. In some embodiments, the reducing agents include polyphenols. Polyphenols are a category of chemicals that contain multiple carbon rings with hydroxide groups attached. An example of a polyphenol is epigallocatechin gallate (EGCG), as shown below.

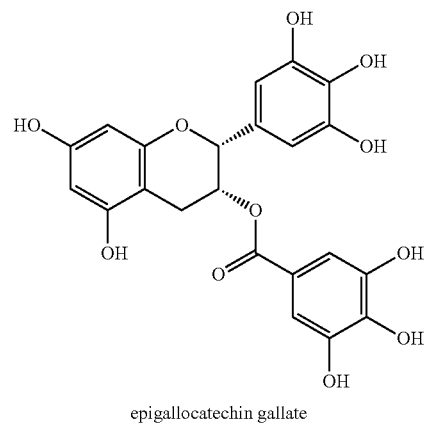 [SMILES: O=C(O[C@@H]1Cc2c(O)cc(O)cc2O[C@@H]1c1cc(O)c(O)c(O)c1)c1cc(O)c(O)c(O)c1]

epigallocatechin gallate

In general, polyphenols are environmentally safe and are naturally occurring in many plants, such as trees and shrubs whose leaves are used to produce tea. Polyphenols can be used to reduce ferric ion to ferrous ion. In some examples, the polyphenols are flavanols, such as epicatechin, and EGCG. Flavanols are the most abundant of the polyphenols, accounting for up to 13% of the weight of green tea. In addition, flavanols are among the most reactive of the polyphenols, and can produce a +3 or +2 reduction of iron. In many instances, polyphenols can selectively reduce iron, while remaining inert to other metals. The energy levels inside the orbitals of the polyphenols match the energy levels needed to reduce the iron to its zero-valance state. In addition to being a reducing agent, polyphenols can also be used as a capping agent.

In addition to the type of solvent used to form the nanoparticles, temperature can also influence nanoparticle synthesis. For example, the higher the temperature of the solvent, the faster the reaction rate. These reactions can be first order, and the rates follow an exponential-temperature dependence. Depending on the surroundings of the nanoparticles, an increase in agglomeration size can occur at higher temperatures as the nanoparticles will be more likely to merge during the initial nucleation and growth processes.

Iron nanoparticles can be prepared by reducing iron salts in an appropriate solvent. For example, ferrous chloride and ferric nitrate can be reduced to iron nanoparticles using a polyphenol. In specific embodiments, reducing agents include Chinese Green Tea (CGT), Bigelow Green Tea, Polyphenon-60 and sodium borohydride.

Figure 2:
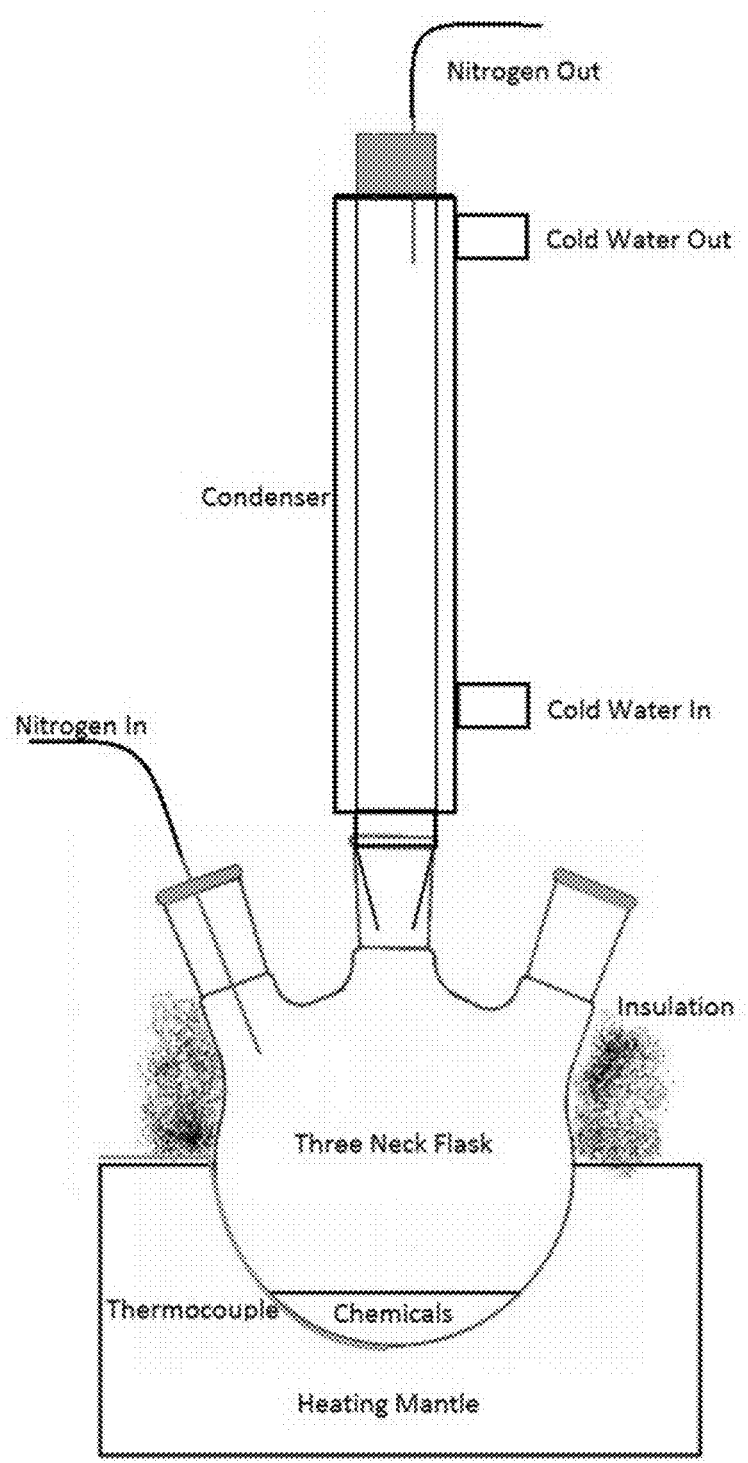
FIG. 2 is a schematic diagram of a reflux apparatus, in accordance with an embodiment of the present disclosure.

FIG. 2 is a schematic diagram of a reflux apparatus, in accordance with an embodiment of the present disclosure. In one set of embodiments, the single neck flask can be filled with a mixture of ferric nitrate nonahydrate and hexadecylamine in a 1:5 molar ratio. A water-cooled condenser is placed in the neck of the flask, and the inlet and outlet of the condenser can be connected to a water chiller. The water chiller can be set to a temperature slightly above the freezing point. The apparatus is placed inside a half spherical mantel with a thermocouple positioned underneath the three-neck flask. The base of the flask can be wrapped in fiberglass insulation. The remaining necks of the flask and the top of the condenser are capped with a septum. The apparatus is purged with nitrogen, and the heating mantel turned on. In various embodiments, the flask is heated to 340-360° C. After 30 to 60 minutes, the heating mantel is turned off and the flask cooled to room temperature. At the bottom of the flask the nanoparticles appear as a black, waxy substance. A solvent, such as methanol, ethanol or hexane, can be added to the wax, causing the particles to go into suspension.

To prepare the polyphenol, a polyphenol source, for example green tea, green tea extract, or polyphenon-60, is added to a solvent, and stirred to form a solution. The solution is filtered several times to remove any large solid contaminates. In some embodiments, some of the solvent can be boiled off to increase the concentration of the polyphenols within the solution. An iron salt, for example ferric or ferrous chloride, can then be added to the solution causing it to turn black in color with a green tint. The solution can be filtered to ready it for characterization and application.

Nanotube Production Methods

One technique for producing nanotubes using the catalysts described herein is floating catalyst chemical vapor deposition (CVD). In one embodiment, a nanoparticle suspension is pumped into a vented tube furnace. The solution can include a sulfur source, such as thiophene or carbon disulfide. The suspension can be nebulized to form a spray of droplets using, for example, a combination of hydrogen, nitrogen, ammonia, helium and/or argon. At a temperature between 1200° C. and 1500° C., the hydrogen and ammonia reduce oxygen or organic compounds on the surface of the nanoparticles. As the carrier liquid evaporates and decomposes, the following occurs according to temperature: (1) ethanol or another carbon source (methanol, butanol, benzene, etc.) breaks down thermally into carbon subspecies ($CH_3$, $C_2H_3$, etc.), (2) the subspecies absorb onto the surface of the nanoparticles, (3) hydrogen is released, and (4) the catalysts become saturated with carbon until the growth of the carbon nanotube commences.

Forest growth of nanotubes is another method that is similar to CVD growth. In forest growth techniques, catalysts are deposited onto a substrate prior to entering a reaction chamber. A hydrogen gas, mixed with argon, is used to reduce the catalysts on the substrate and purge the chamber of oxygen. The substrate is then heated to 750° C. to 1000° C. A fuel source, such as ethanol, is added in gaseous form. As the fuel is broken down, it is deposited onto the surface of the catalysts and the nanotubes grow attached to the substrate. The nanotubes can grow in the same direction and appear to look like a forest.

Experimental Results—Ferrous Chloride-Polyphenol Synthesis

Figure 3:
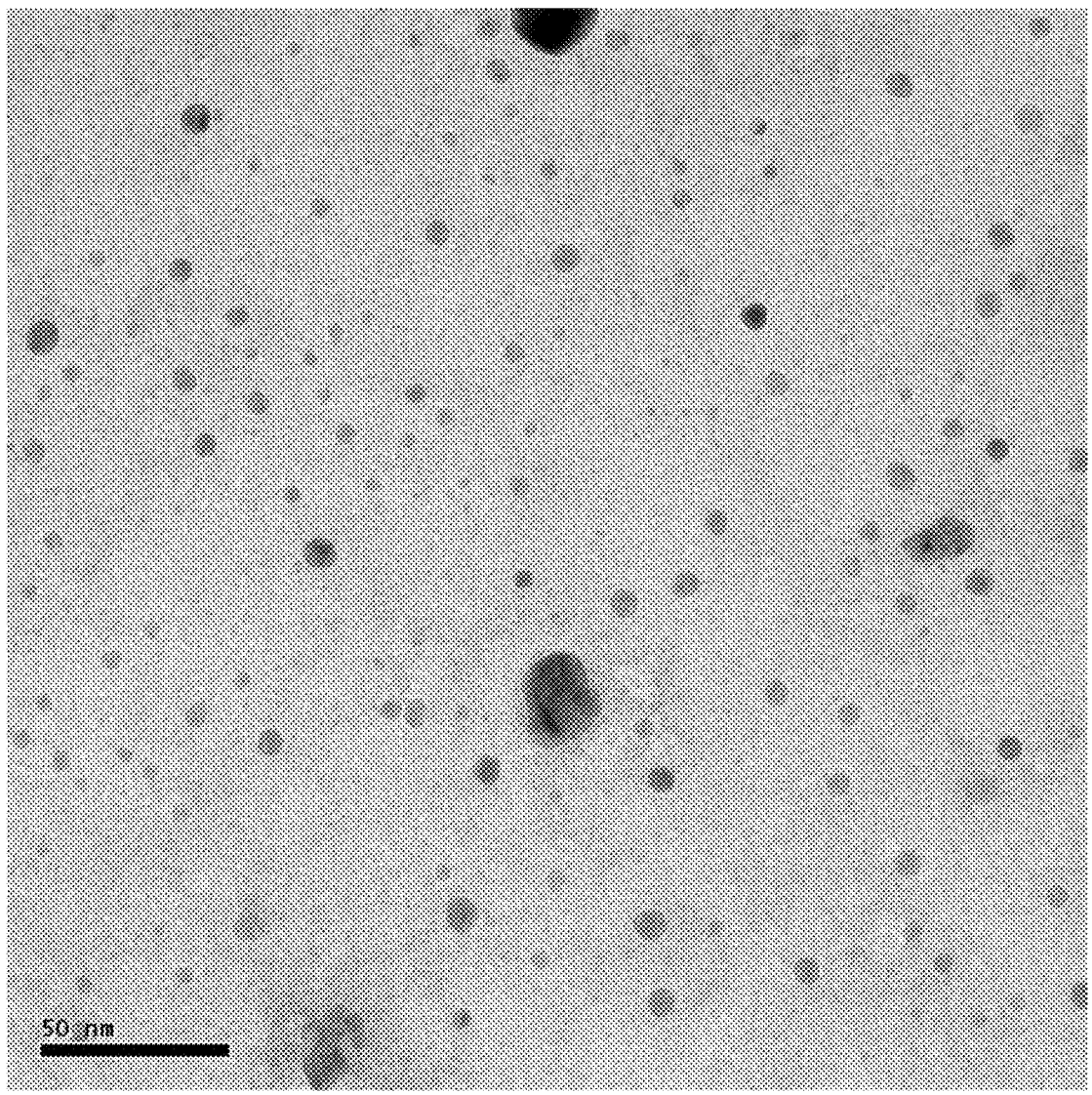
FIG. 3 is a transmission electron microscope (TEM) image of polyphenol coated iron nanoparticles, in accordance with one embodiment of the present disclosure.
Figure 4:
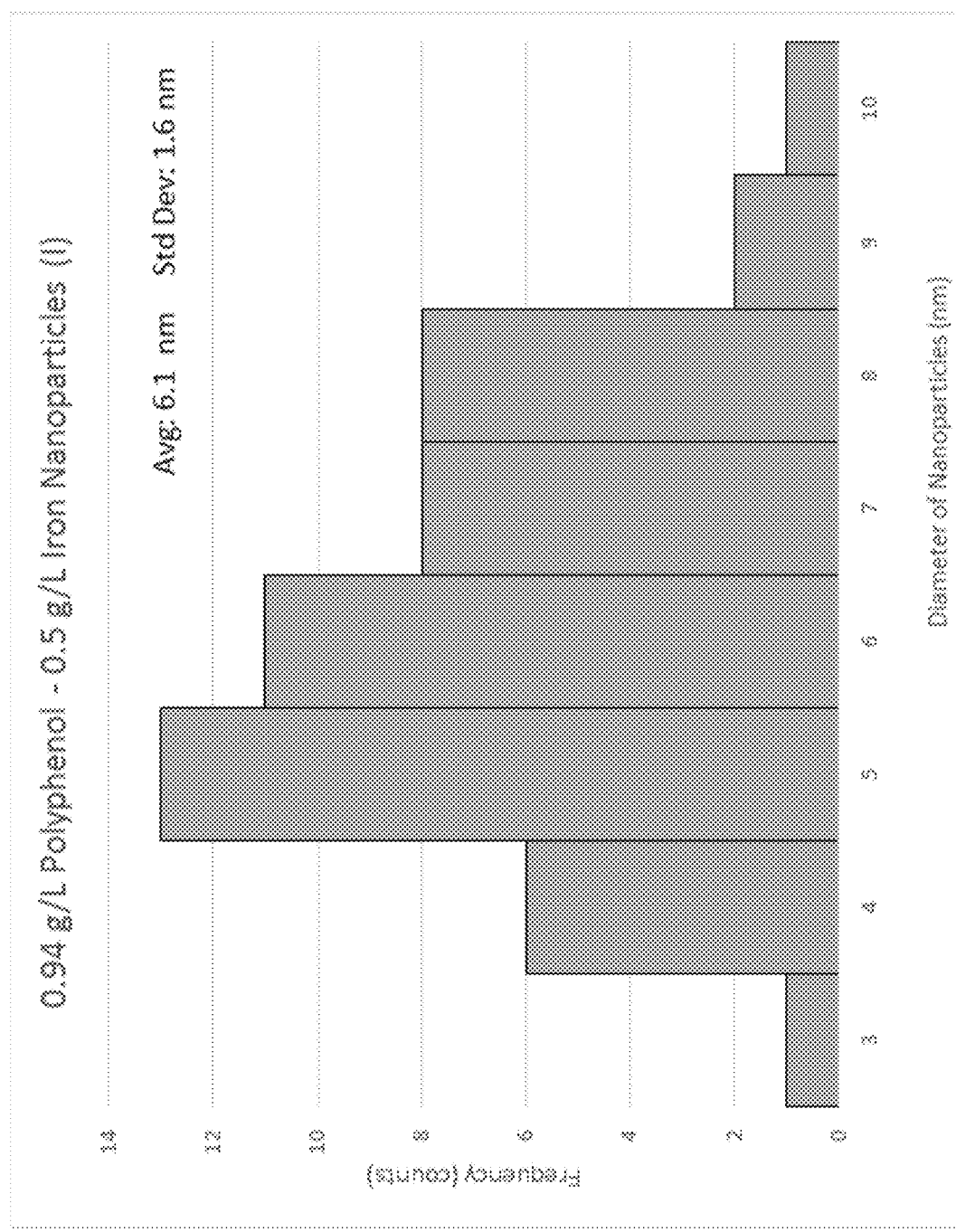
FIG. 4 is a histogram illustrating a size distribution of 50 Chinese Green Tea (CGT) polyphenol coated iron nanoparticles from 0.5 g/L iron solution, in accordance with an embodiment of the present disclosure.

FIG. 3 is a transmission electron microscope (TEM) image of polyphenol coated iron nanoparticles, in accordance with one embodiment of the present disclosure. FIG. 4 is a histogram illustrating a size distribution of 50 Chinese Green Tea (CGT) polyphenol coated iron nanoparticles produced from a solution containing 0.5 g/L of iron. In one experiment, nanoparticles, as shown in FIG. 3, were formed using ferrous chloride and a polyphenol reducing agent mixture at an iron concentration of 0.5 g/L iron. Unlike nanoparticles produced using hexadecylamine, these nanoparticles did not agglomerate or otherwise collect together. The nanoparticles exhibited a darker core, followed by a lighter band along the outside. This may indicate the presence of a coating on the nanoparticles, or more concentrated iron in a subsection of the particle. The nanoparticles can include bright spots that indicate a crystalline nature of the particles. The average size of the nanoparticles produced was 6.1 nanometers (nm) in diameter with a standard deviation of 1.6 nm, as shown in FIG. 4.

Figure 5:
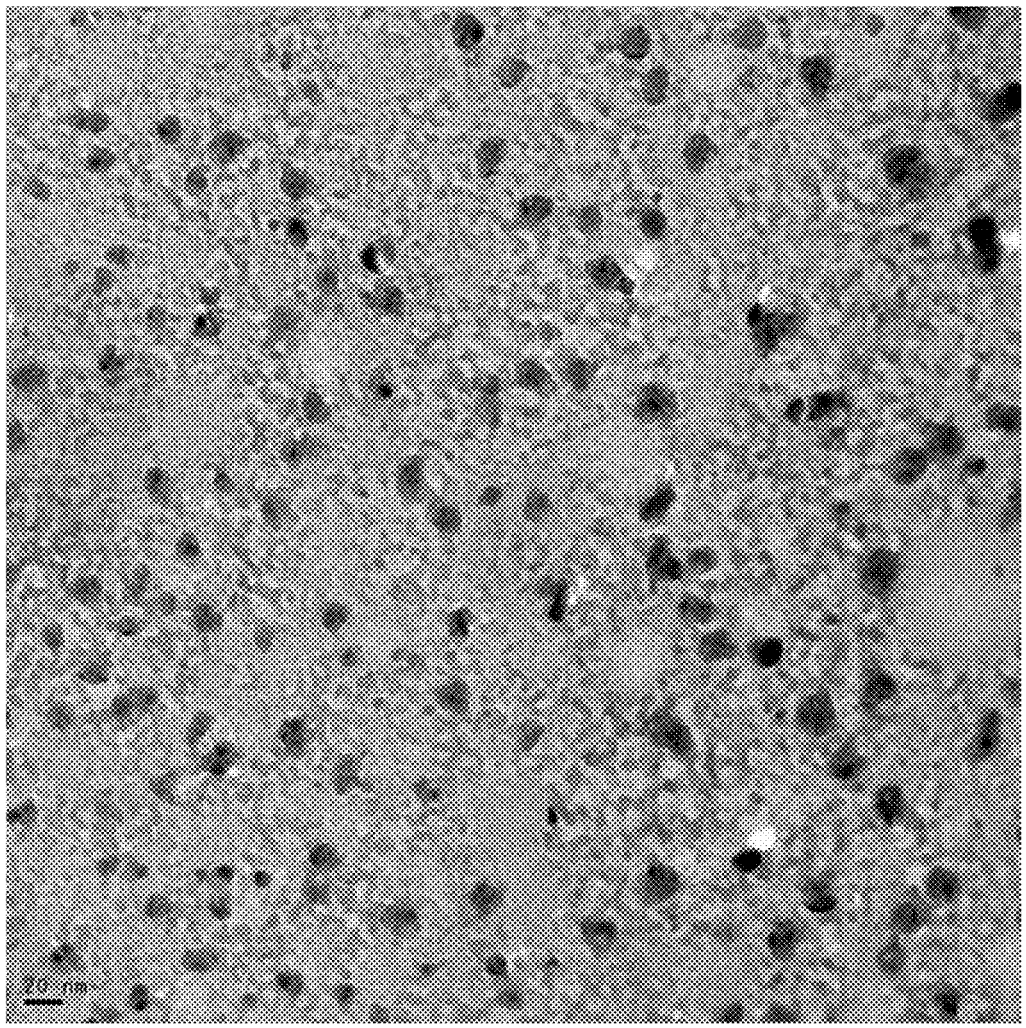
FIG. 5 is a TEM image of 0.5 g/l iron nanoparticles created at 0° C. in Bigelow-Ethanol Tea (BET), in accordance with another embodiment of the present disclosure.
Figure 6:
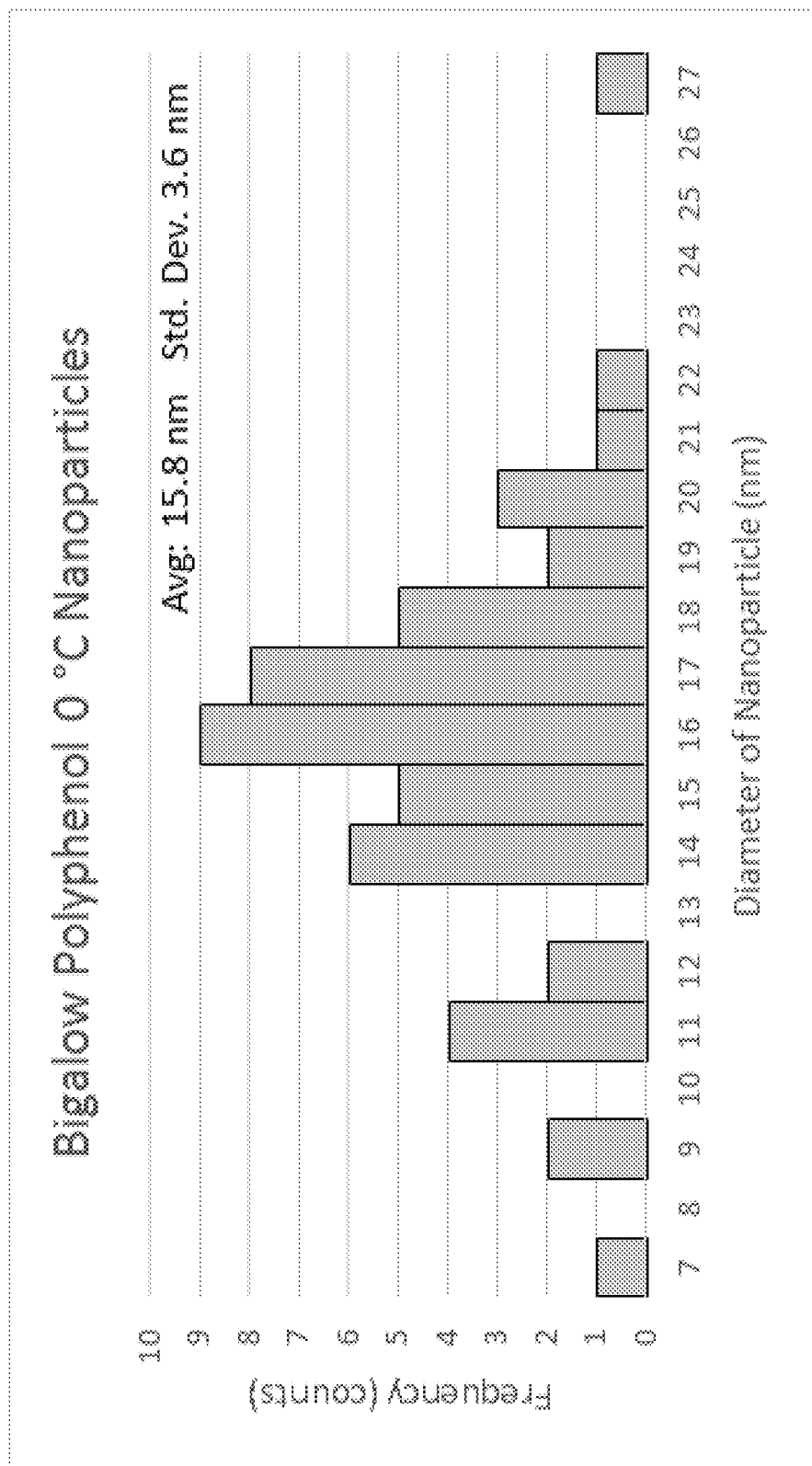
FIG. 6 is a histogram illustrating a size distribution of 0.5 g/l iron nanoparticles at 0° C. in BET, in accordance with an embodiment of the present disclosure.

In another set of experiments, iron nanoparticles were formed at three different temperatures, 0° C., 25° C. and 70° C., using Bigelow-Ethanol Tea (BET) as a reducing and capping agent. FIG. 5 is a TEM image of (0.5 g/L Fe) iron nanoparticles created at 0° C. using BET as a reducing and capping agent. FIG. 6 is a histogram illustrating a size distribution of the nanoparticles shown in FIG. 5. The shape of the nanoparticles shown in FIG. 5 is different from the nanoparticles shown in FIG. 3 that appear to be more rod-like. As can be seen in FIG. 6, the nanoparticles have an average diameter of 15.78 nm with a standard deviation of 3.60 nm.

Figure 7:
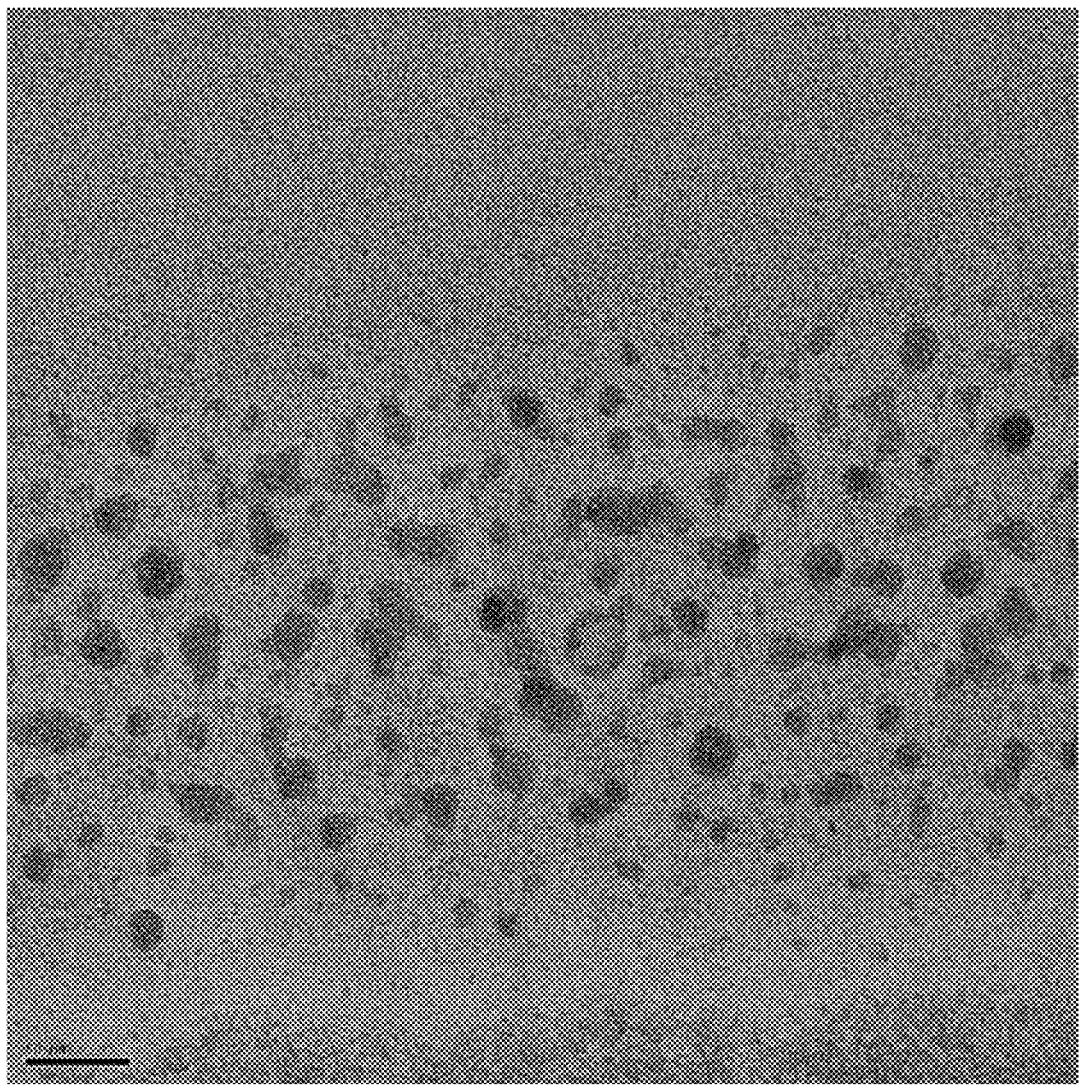
FIG. 7 is a TEM image of 0.5 g/l iron nanoparticles at 25° C. in BET, in accordance with another embodiment of the present disclosure.
Figure 8:
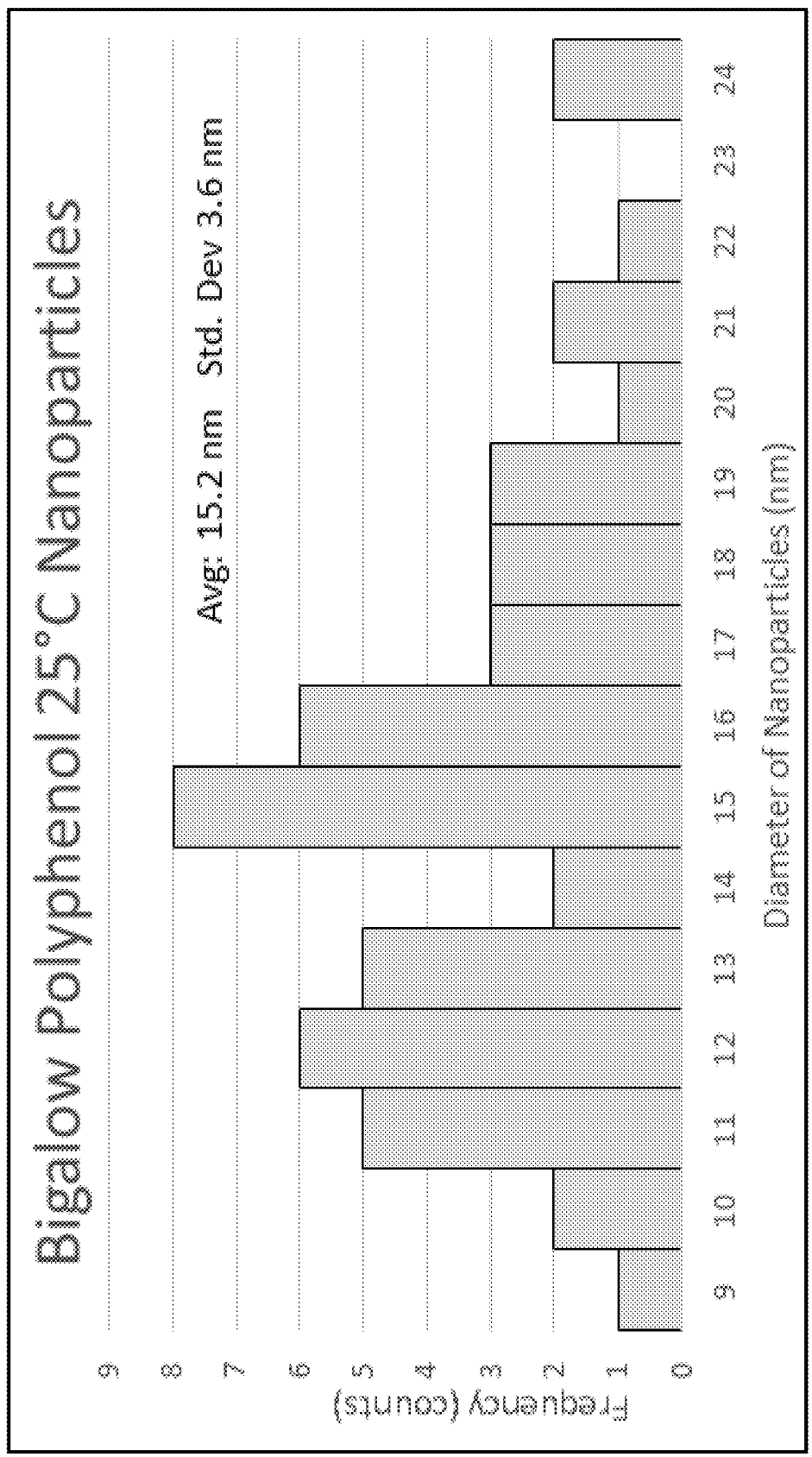
FIG. 8 is a histogram illustrating a size distribution of 0.5 g/l iron nanoparticles at 25° C. in BET, in accordance with an embodiment of the present disclosure.

FIG. 7 is a TEM image of the 0.5 g/l iron nanoparticles produced at 25° C. in BET, in accordance with another embodiment of the present disclosure. FIG. 8 is a histogram illustrating a size distribution of these iron nanoparticles. The nanoparticles are less rod like in shape and include some aggregation of nanoparticles. As illustrated in FIG. 8, the nanoparticles have an average diameter of 15.2 nm and a standard deviation of 3.6 nm.

Figure 9:
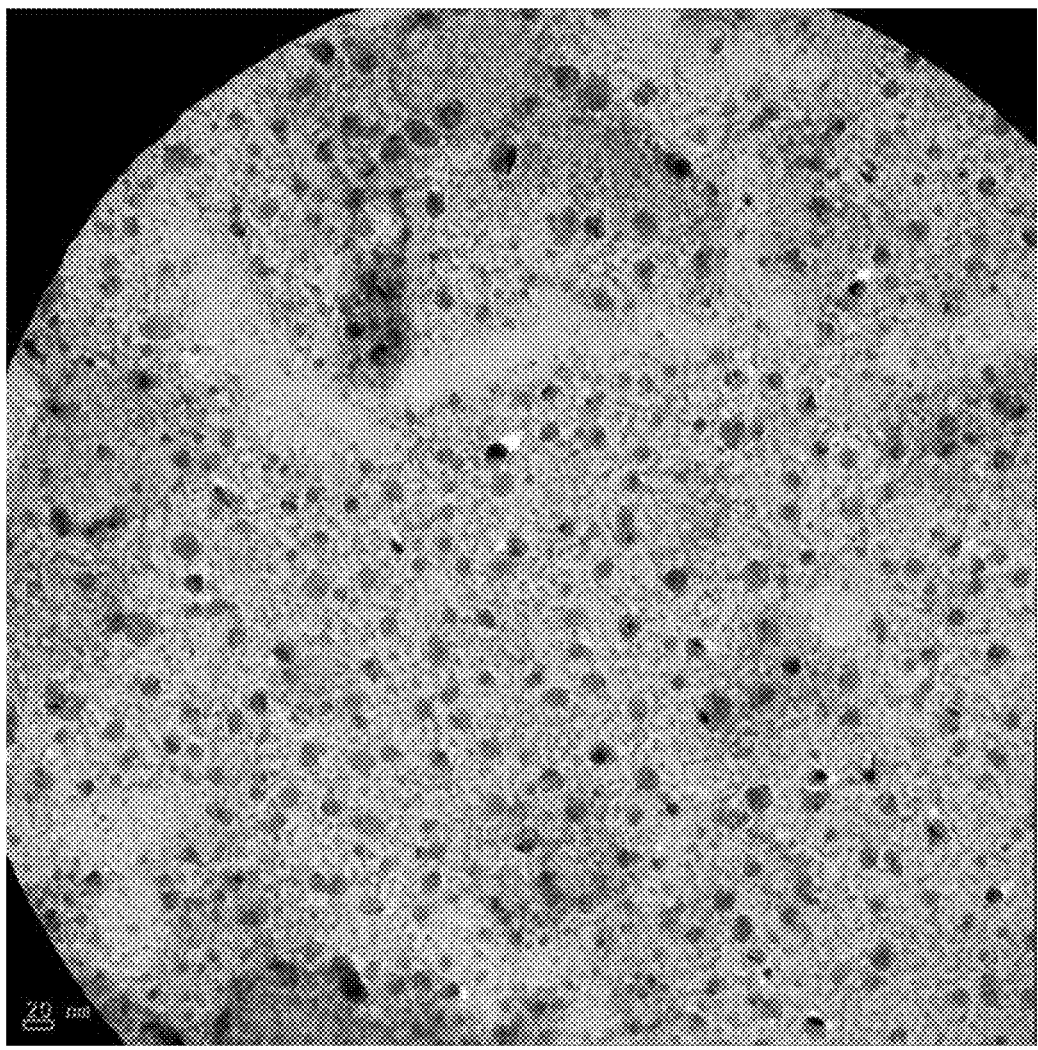
FIG. 9 is a TEM image of 0.5 g/l iron nanoparticles at 70° C. in BET, in accordance with another embodiment of the present disclosure.
Figure 10:
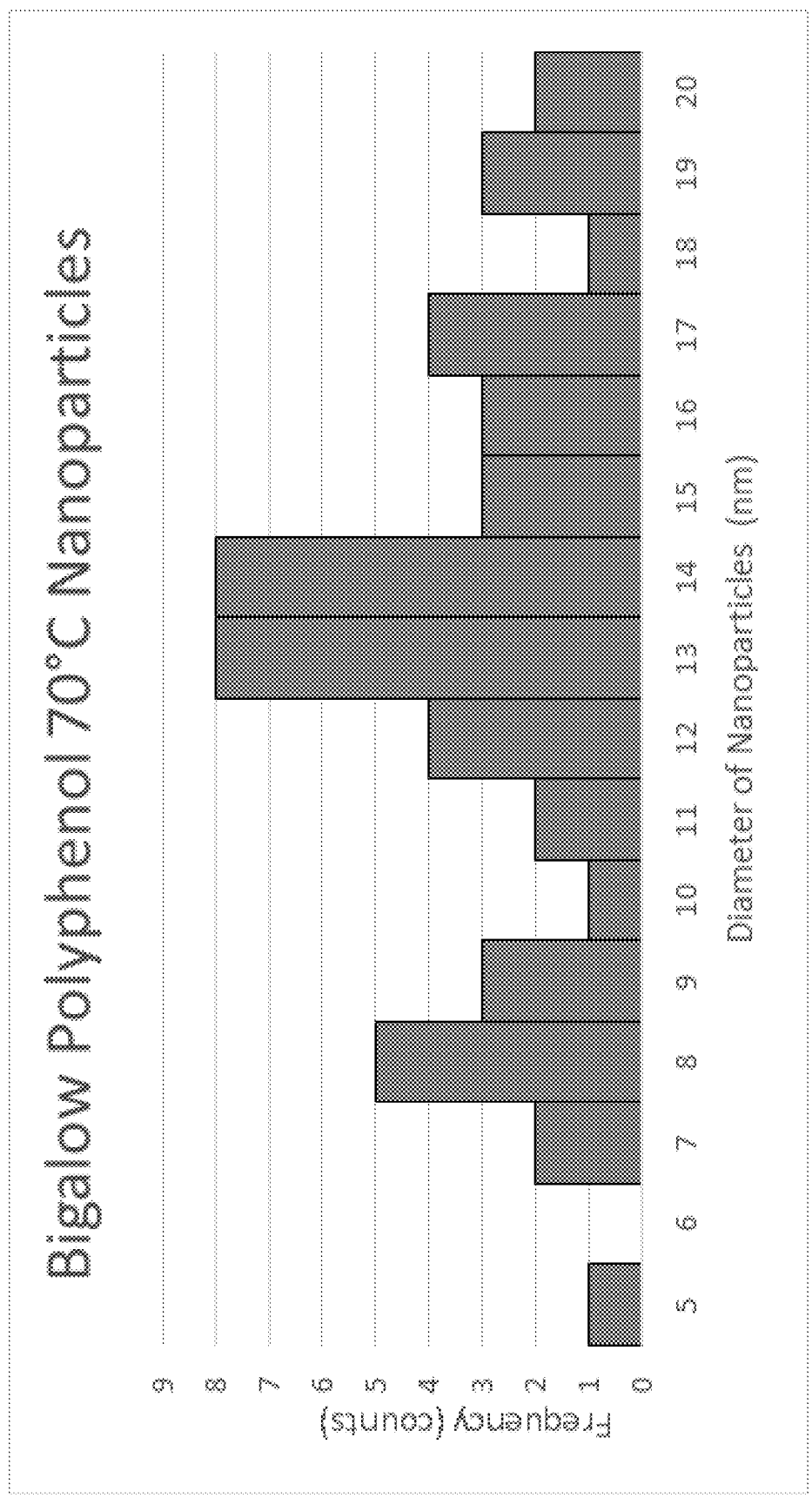
FIG. 10 is a histogram illustrating a size distribution of 0.5 g/l iron nanoparticles at 70° C. in BET, in accordance with an embodiment of the present disclosure.

FIG. 9 is a TEM image of the 0.5 g/l iron nanoparticles produced at 70° C. in BET, in accordance with another embodiment of the present disclosure. FIG. 10 is a histogram illustrating a size distribution of 0.5 g/l iron nanoparticles at 70° C. in BET. The nanoparticles are smaller than either of the particles shown in FIG. 5 and FIG. 7 and include some minor agglomerations of nanoparticles. As shown in FIG. 10, the nanoparticles have an average diameter of 13.1 nm and a standard deviation of 3.7 nm.

Figure 11:
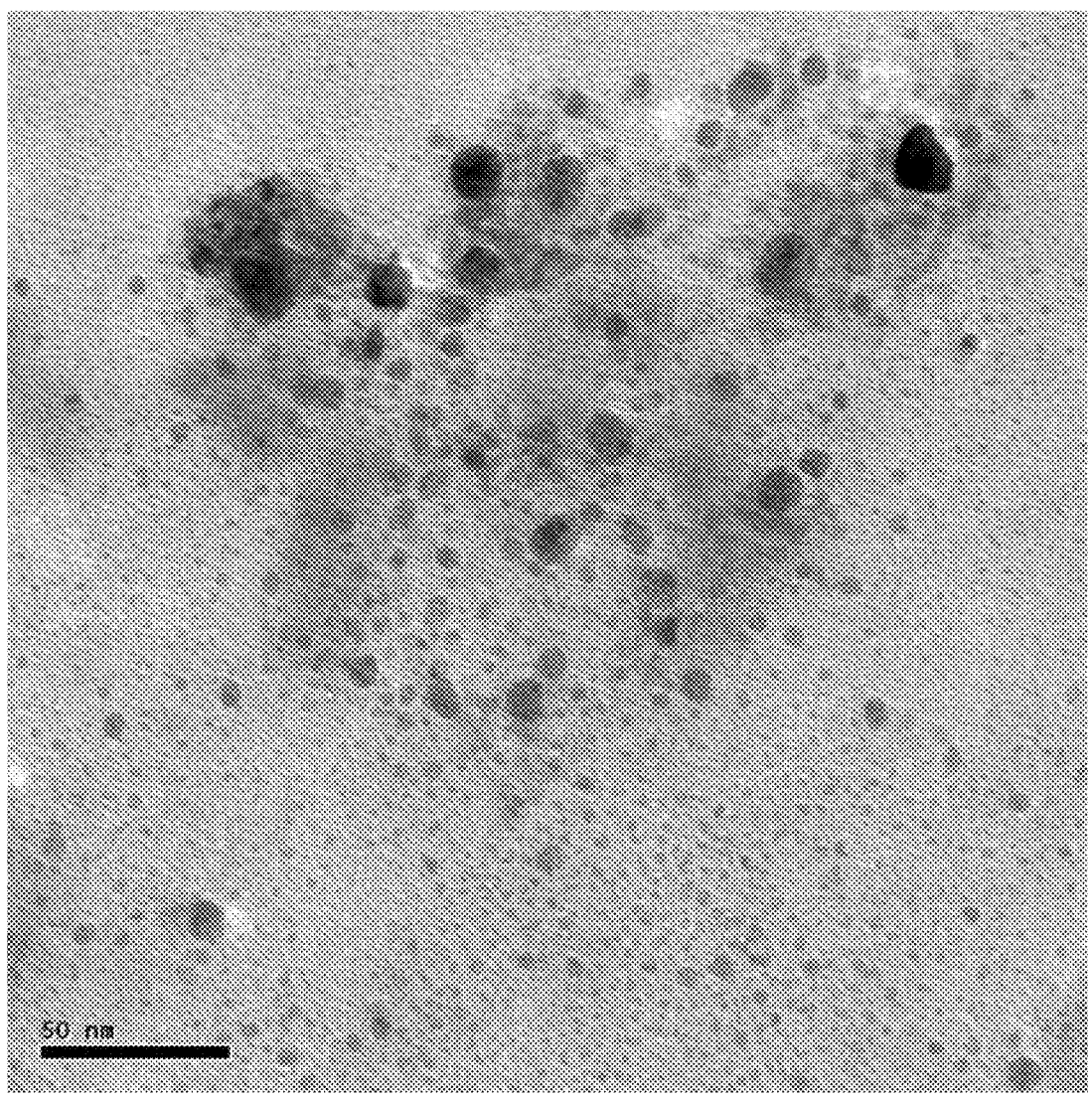
FIG. 11 is a TEM image of nanoparticles made from 0.1 g/L iron with 0.94 g/L CGT polyphenols, in accordance with another embodiment of the present disclosure.
Figure 12:
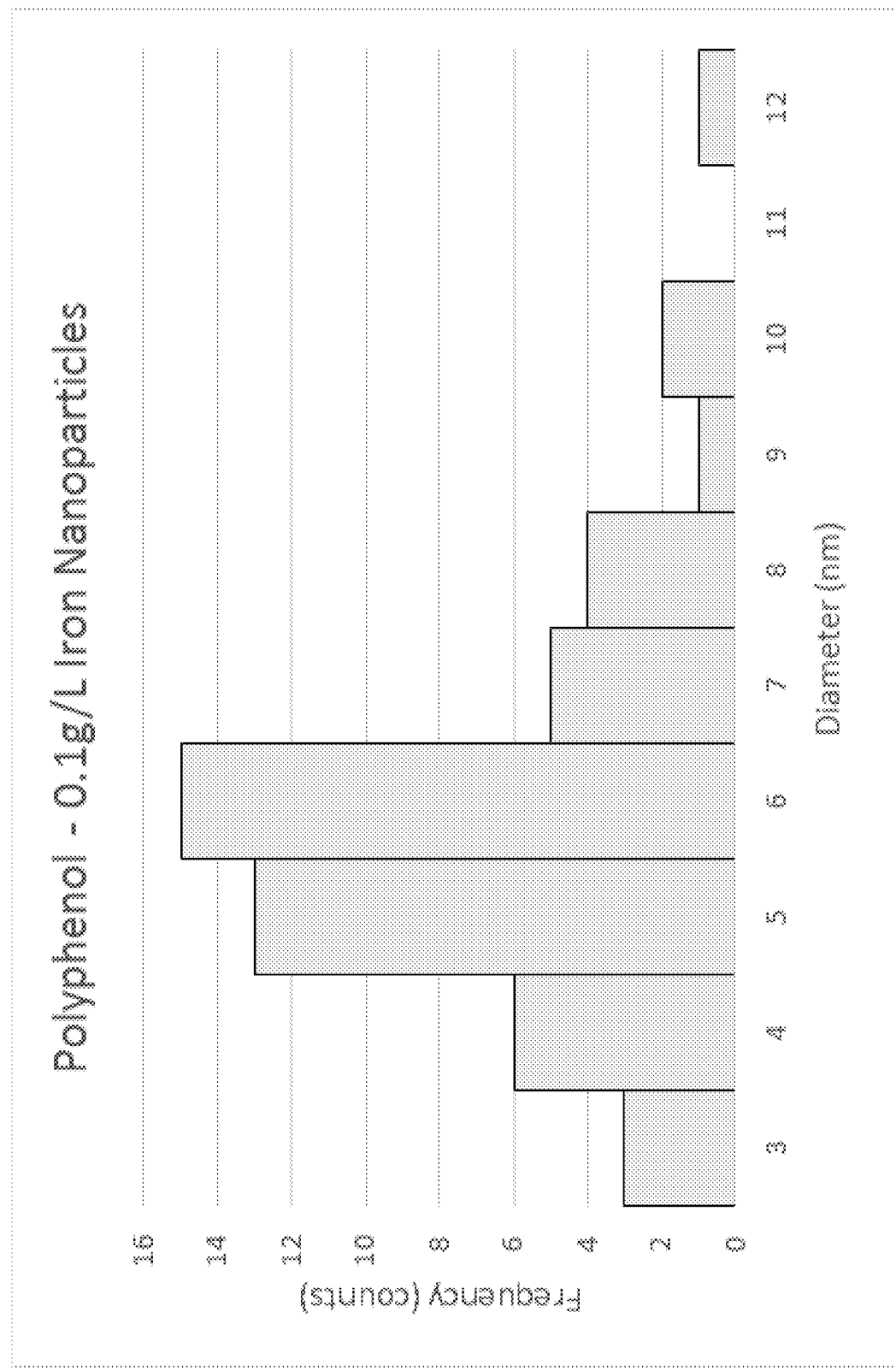
FIG. 12 is a histogram illustrating a size distribution of nanoparticles made from 0.1 g/L iron with 0.94 g/L CGT polyphenols, in accordance with an embodiment of the present disclosure.

In another set of experiments, the concentration of iron was varied between 0.1, 0.5 and 2.5 g/L. FIG. 11 is a TEM image of nanoparticles made from 0.1 g/L iron with 0.94 g/L CGT polyphenols, in accordance with another embodiment of the present disclosure. FIG. 12 is a histogram illustrating a size distribution of these nanoparticles. As can be seen in FIG. 11, several large nanoparticles, above 20 nm in diameter, are surrounded by smaller nanoparticles. The smaller nanoparticles have a substantially similar appearance. In particular, the nanoparticles have no internal patterns, or grain boundaries, and thus appear to be single domain nanoparticles. As shown in FIG. 12, the nanoparticles have an average size of 6.0 nm and a standard deviation of 1.8 nm. Note, nanoparticles with a size larger than 12 nm were removed in this analysis because the size of these particles was likely caused by a ripening process resulting in agglomeration of some of the nanoparticles.

Figure 13:
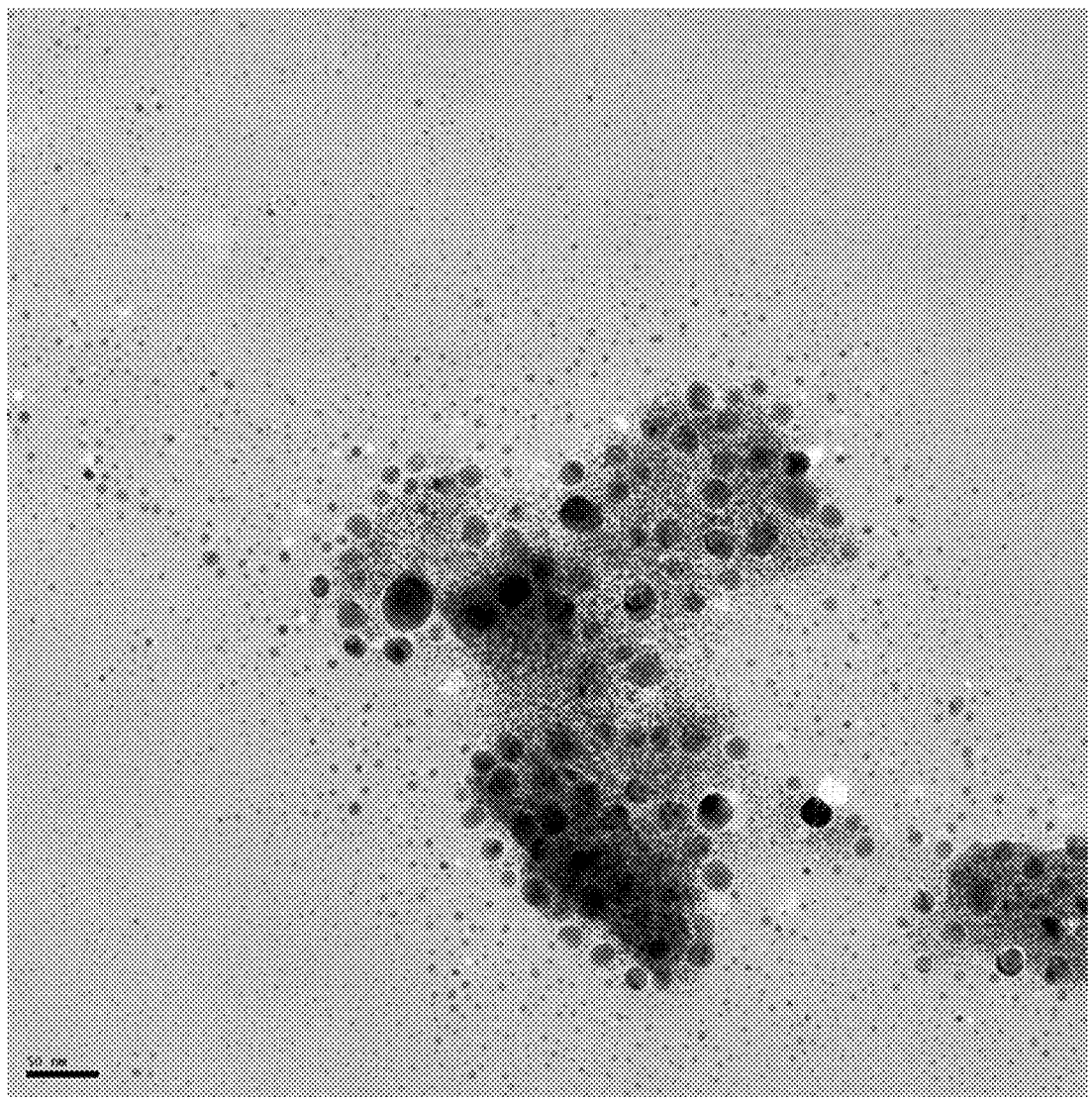
FIG. 13 is a TEM image of nanoparticles made from 0.5 g/L iron with 0.94 g/L CGT polyphenols, in accordance with another embodiment of the present disclosure.
Figure 14:
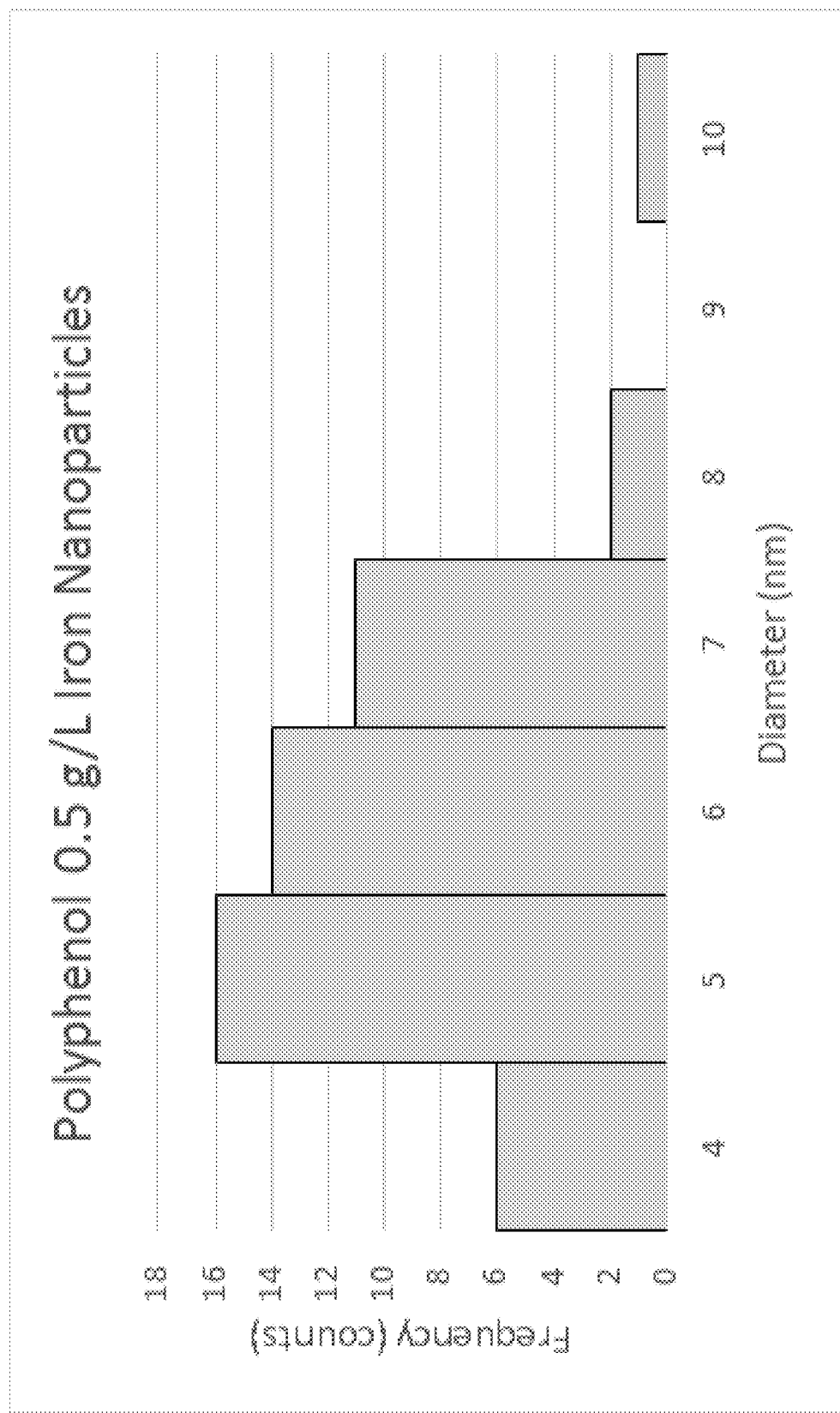
FIG. 14 is a histogram illustrating a size distribution of nanoparticles made from 0.5 g/L iron with CGT 0.94 g/L polyphenols, in accordance with an embodiment of the present disclosure.

FIG. 13 is a TEM image of nanoparticles made from 0.5 g/L iron with 0.94 g/L CGT polyphenols, in accordance with another embodiment of the present disclosure. FIG. 14 is a histogram illustrating a size distribution of these nanoparticles. As shown in FIG. 13, larger nanoparticles are surrounded by much smaller nanoparticles. The smaller nanoparticles are substantially uniform in appearance with a few nanoparticles being darker in color than the others. However, the larger nanoparticles include patterns, such as dark lines running down the center and double triangles that are indicative of multi-domain nanoparticles and different crystal orientations. As illustrated in FIG. 14, the nanoparticles have an average diameter of 5.8 nm and a standard deviation of 1.2 nm.

Figure 15:
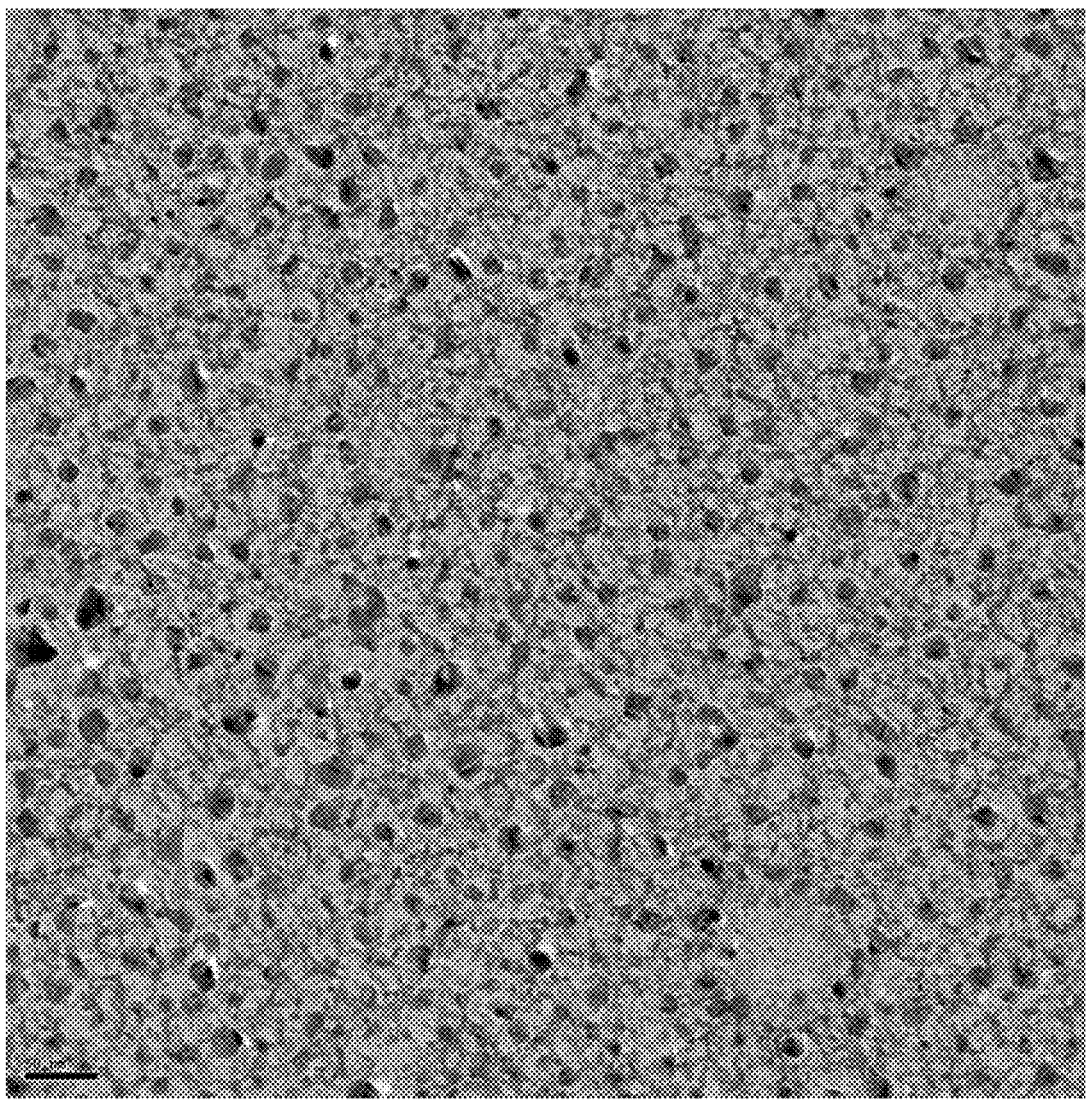
FIG. 15 is a TEM image of nanoparticles made from 2.5 g/L iron with 0.94 g/L CGT polyphenols, in accordance with another embodiment of the present disclosure.
Figure 16:
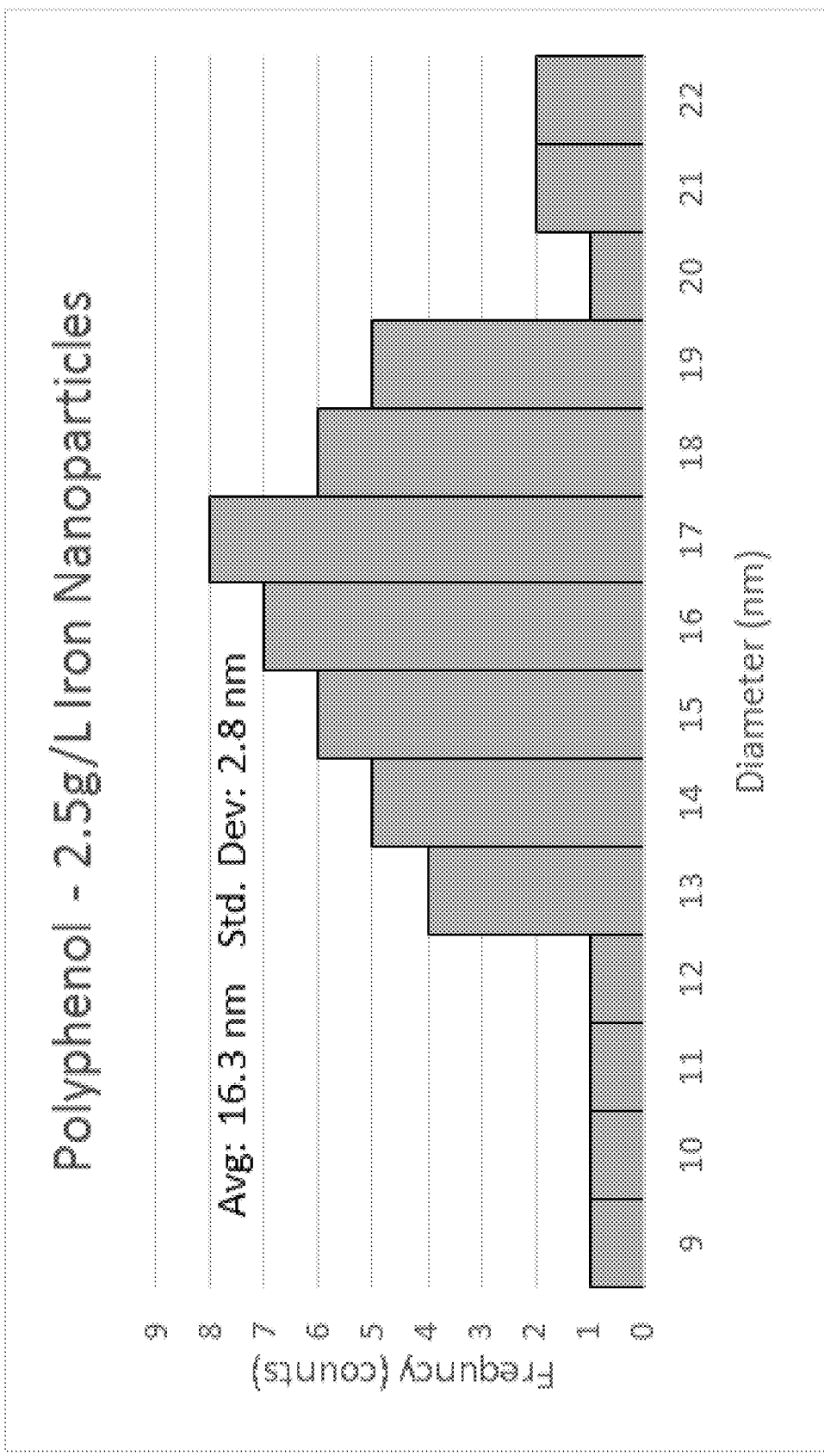
FIG. 16 is a histogram illustrating a size distribution of nanoparticles made from 2.5 g/L iron with 0.94 g/L CGT polyphenols, in accordance with an embodiment of the present disclosure.

FIG. 15 is a TEM image of nanoparticles made from 2.5 g/L iron with 0.94 g/L CGT polyphenols, in accordance with another embodiment of the present disclosure. FIG. 16 is a histogram illustrating a size distribution of these nanoparticles. As shown in FIG. 15, these nanoparticles are multi-domain particles and represent cryptographic twinning. Some of these nanoparticles have three-fold symmetry and appear triangular in shape compared to the nanoparticles produced above. The nanoparticles have an average diameter of 16.3 nm and a standard deviation of 2.8 nm, as shown by FIG. 16. Thus, the nanoparticles are larger in size and distribution than nanoparticles produced from other solutions that included the same amount of polyphenols but lower concentrations of iron.

Figure 17:
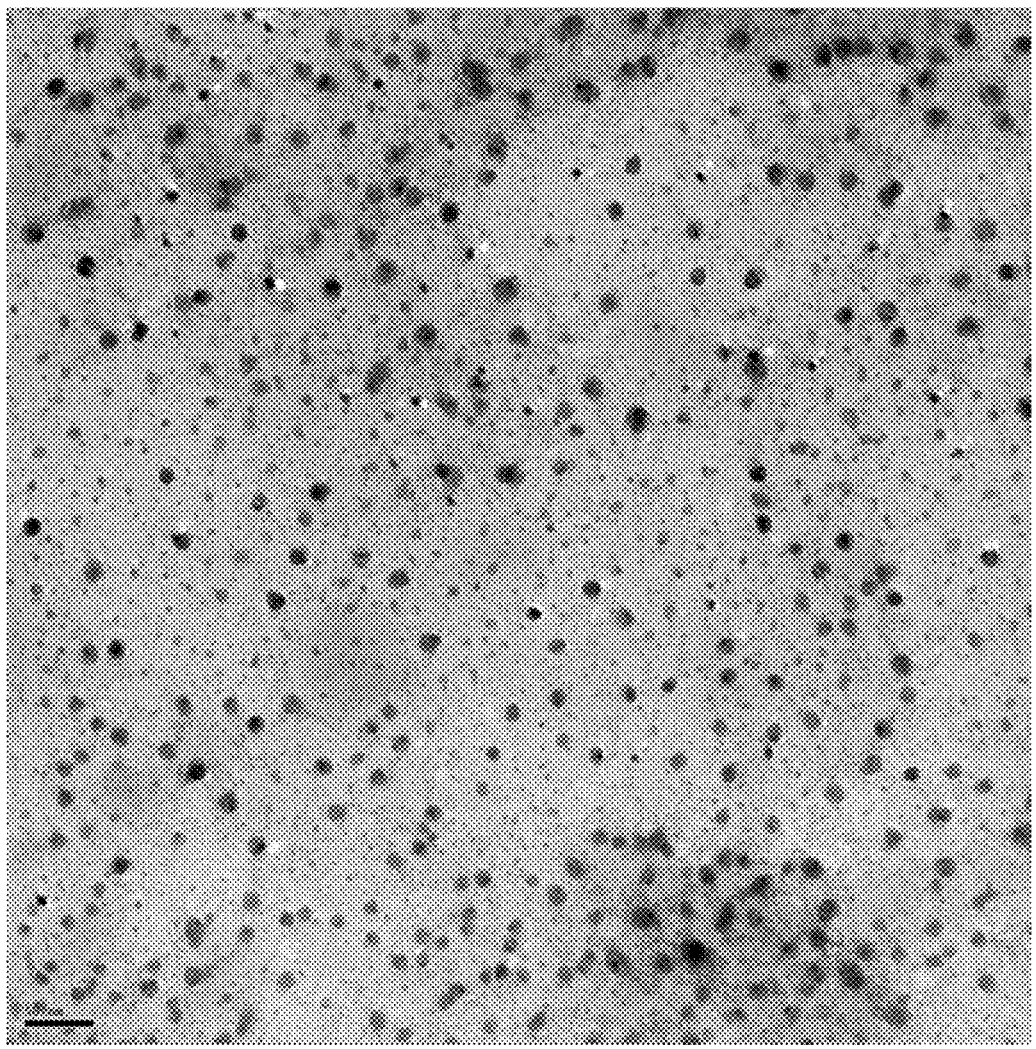
FIG. 17 is a TEM image of nanoparticles made from 0.5 g/L iron with 1.5 g/L CGT polyphenols, in accordance with another embodiment of the present disclosure.
Figure 18:
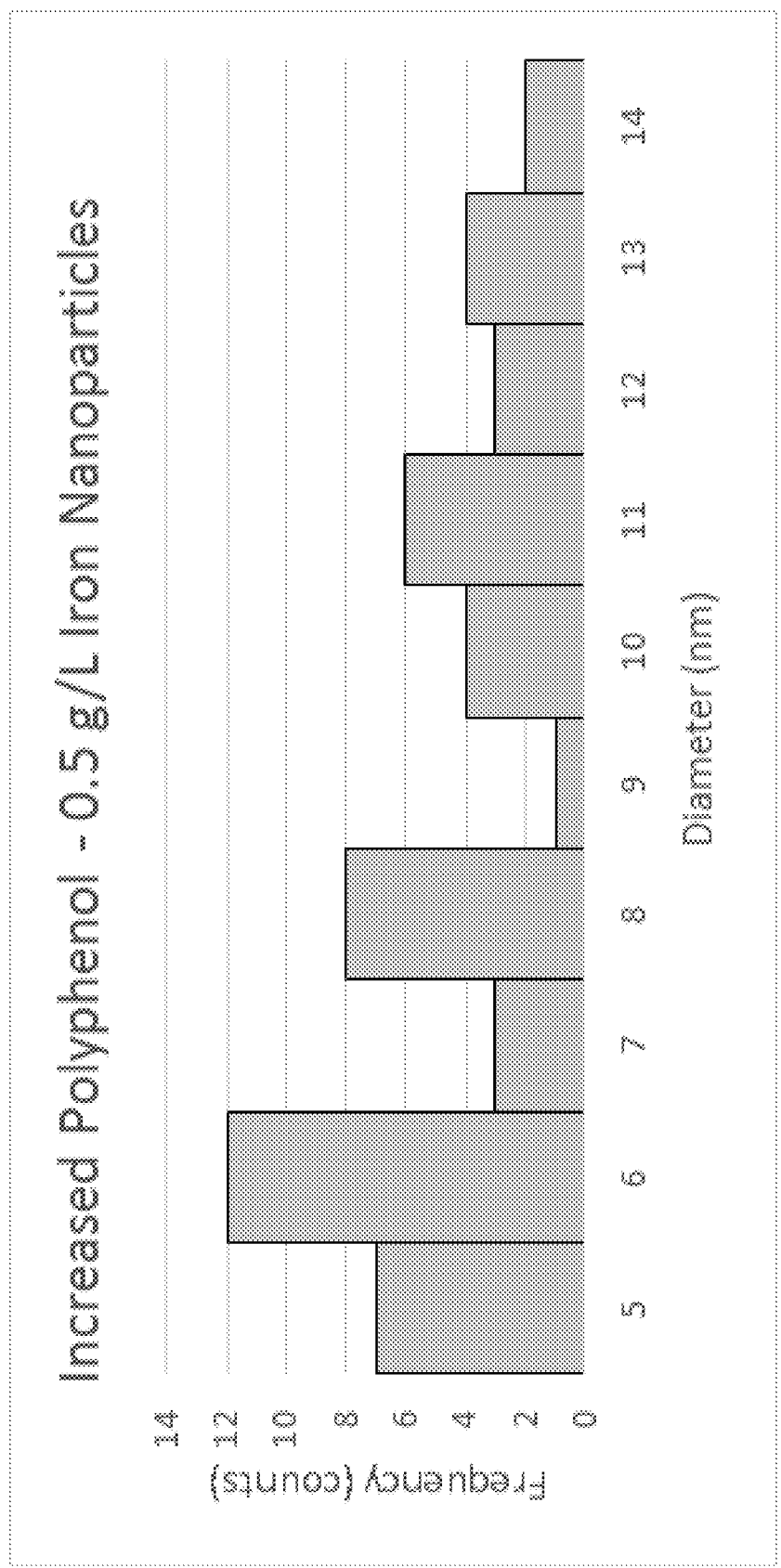
FIG. 18 is a histogram illustrating a size distribution of nanoparticles made from 0.5 g/L with 1.5 g/L CGT polyphenols, in accordance with an embodiment of the present disclosure.

FIG. 17 is a TEM image of nanoparticles made from 0.5 g/L iron (ferrous chloride) with 1.5 g/L CGT polyphenols, in accordance with another embodiment of the present disclosure. FIG. 18 is a histogram illustrating a size distribution of these nanoparticles made from 0.5 g/L with 1.5 g/L CGT polyphenols. As can be seen in FIG. 17, the medium sized (e.g., about 10 nm particles) nanoparticles are evenly spaced with the smaller nanoparticles and the larger nanoparticles (e.g., 20 nm particles) are absent. Like the previous images, the larger sized nanoparticles have dark lines, and spots inside of them, while the smaller nanoparticles are mostly uniform. As shown in FIG. 18, the nanoparticles have an average particle size of 8.5 nm and a standard deviation of 2.9 nm. The large majority of the nanoparticles, however, are about 6 nm in diameter.

Figure 19:
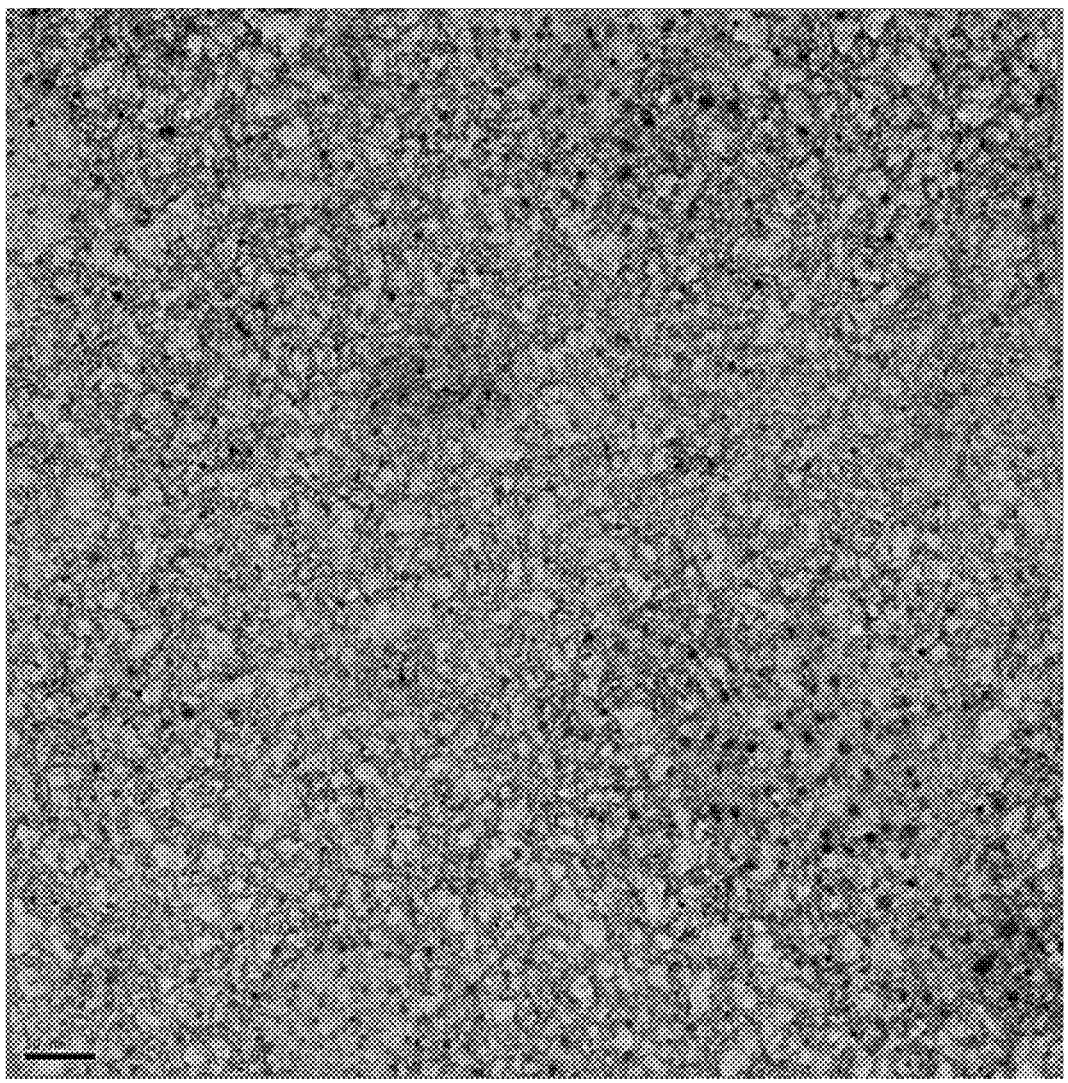
FIG. 19 is a TEM image of nanoparticles made from 2.5 g/L iron with 1.5 g/L CGT polyphenols, in accordance with an embodiment of the present disclosure.
Figure 20:
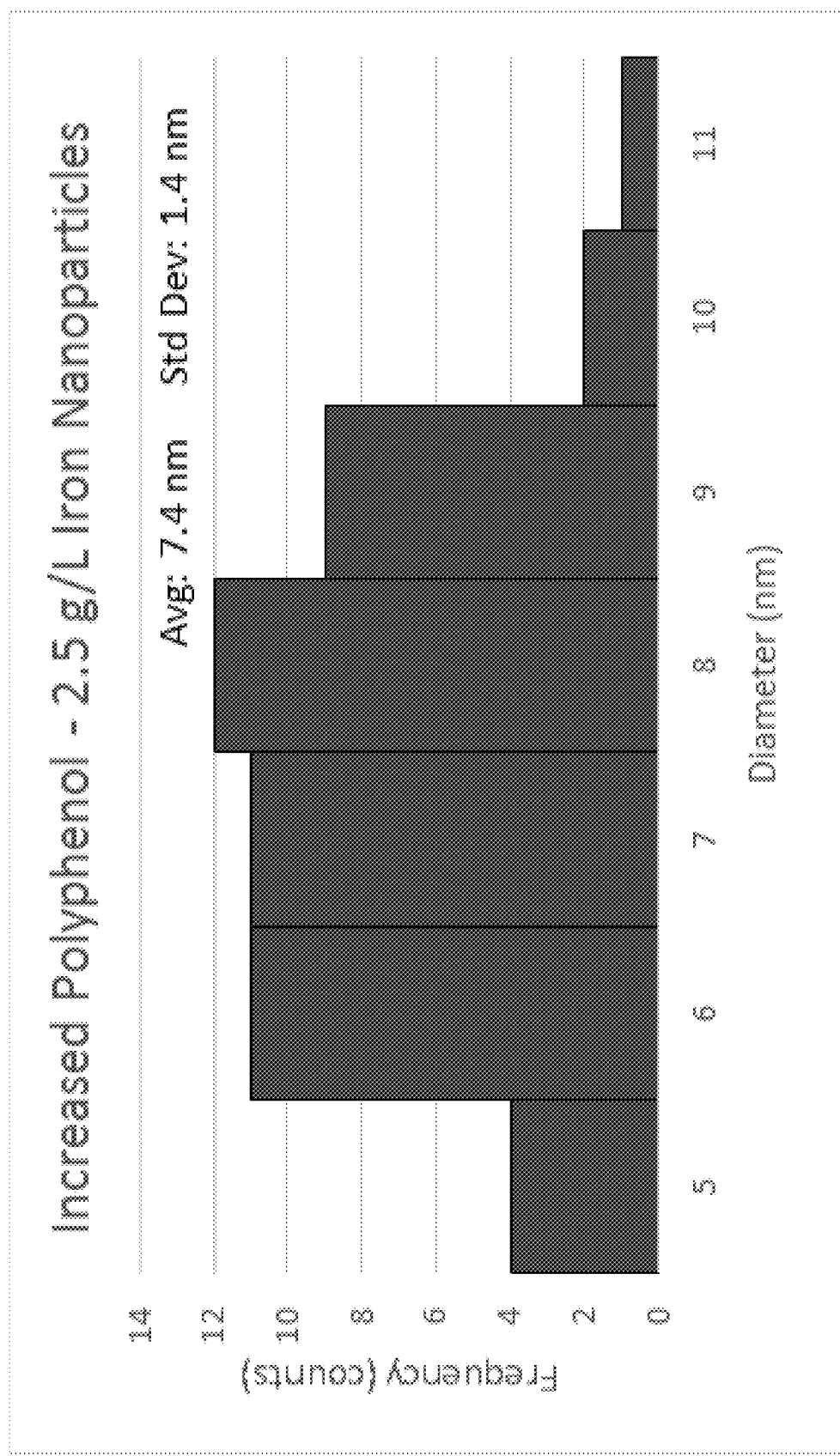
FIG. 20 is a histogram illustrating a size distribution of nanoparticles made from 2.5 g/L Iron with 1.5 g/L CGT polyphenols, in accordance with an embodiment of the present disclosure.

FIG. 19 is a TEM image of nanoparticles made from 2.5 g/L iron (ferrous chloride) with 1.5 g/L CGT polyphenols, in accordance with an embodiment of the present disclosure. FIG. 20 is a histogram illustrating a size distribution of these nanoparticles. As illustrated in FIG. 20, the nanoparticles have an average diameter of 7.4 nm and a standard deviation of 1.4 nm.

Figure 21:
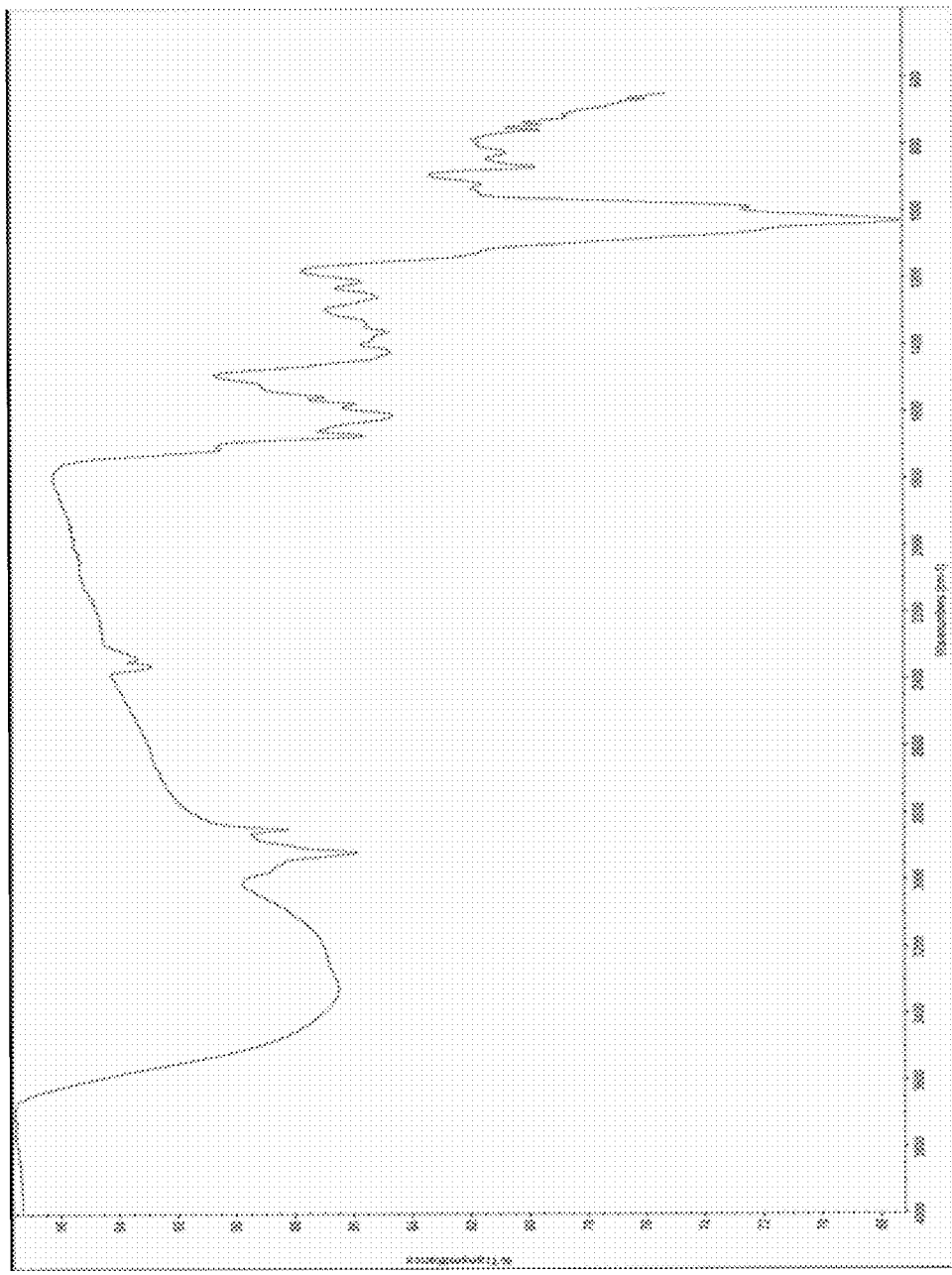
FIG. 21 is an infrared transmittance spectra of polyphenol coated nanoparticles, in accordance with an embodiment of the present disclosure.

FIG. 21 is an infrared transmittance spectra of polyphenol coated nanoparticles, made using 0.5 g/L iron with 1.5 g/L CGT, in accordance with an embodiment of the present disclosure. As can be seen, the spectrum indicates that there is a lack of C=O bonds. This bond is present in ECGC and many other polyphenols and would normally appear at around 1750 cm$^{-1}$. The four bonds that are most present are the O—H bond at 3300 cm$^{-1}$, the C—H bond at 3000 cm$^{-1}$, the aromatic C=C bonds between 1500 and 1250 cm$^{-1}$, and the very strong C—O bond peak at 1000 cm$^{-1}$.

The infrared absorption spectrum of 0.5 g/L iron with 1.5 g/L CGT suggests a lack of carbon double bonded to oxygen. These bonds are very prominent in many of the polyphenols such as EGCG and are believed to aid in reducing the iron salt. The lack of a strong absorption peak in this spectrum indicates a reduction in the number of carbon oxygen double bonds that may result from the reduction of the iron by the polyphenol.

Figure 22:
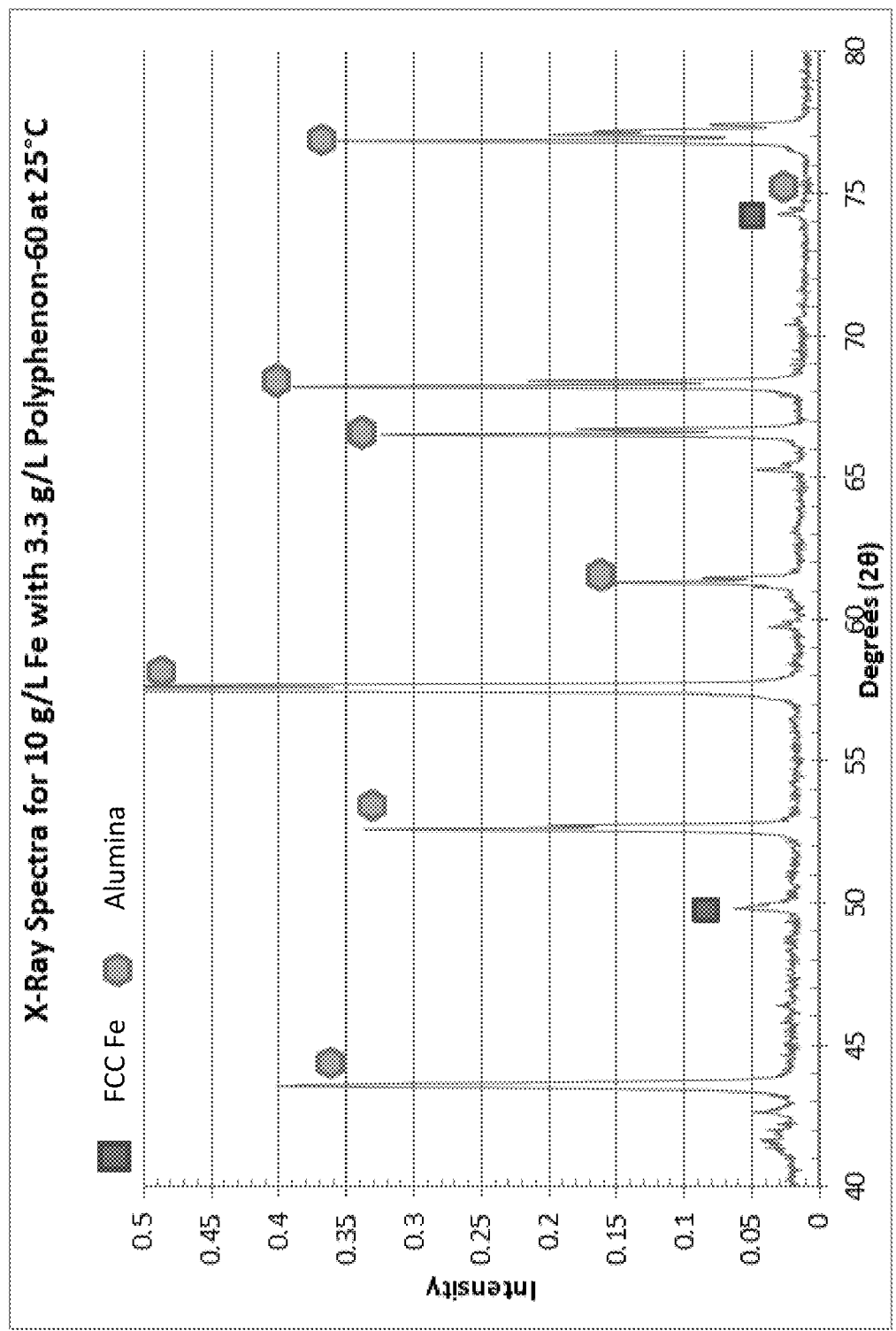
FIG. 22 provides x-ray diffraction data for 10 g/L iron nanoparticles at 25° C. on a linear scale, in accordance with an embodiment of the present disclosure.
Figure 23:
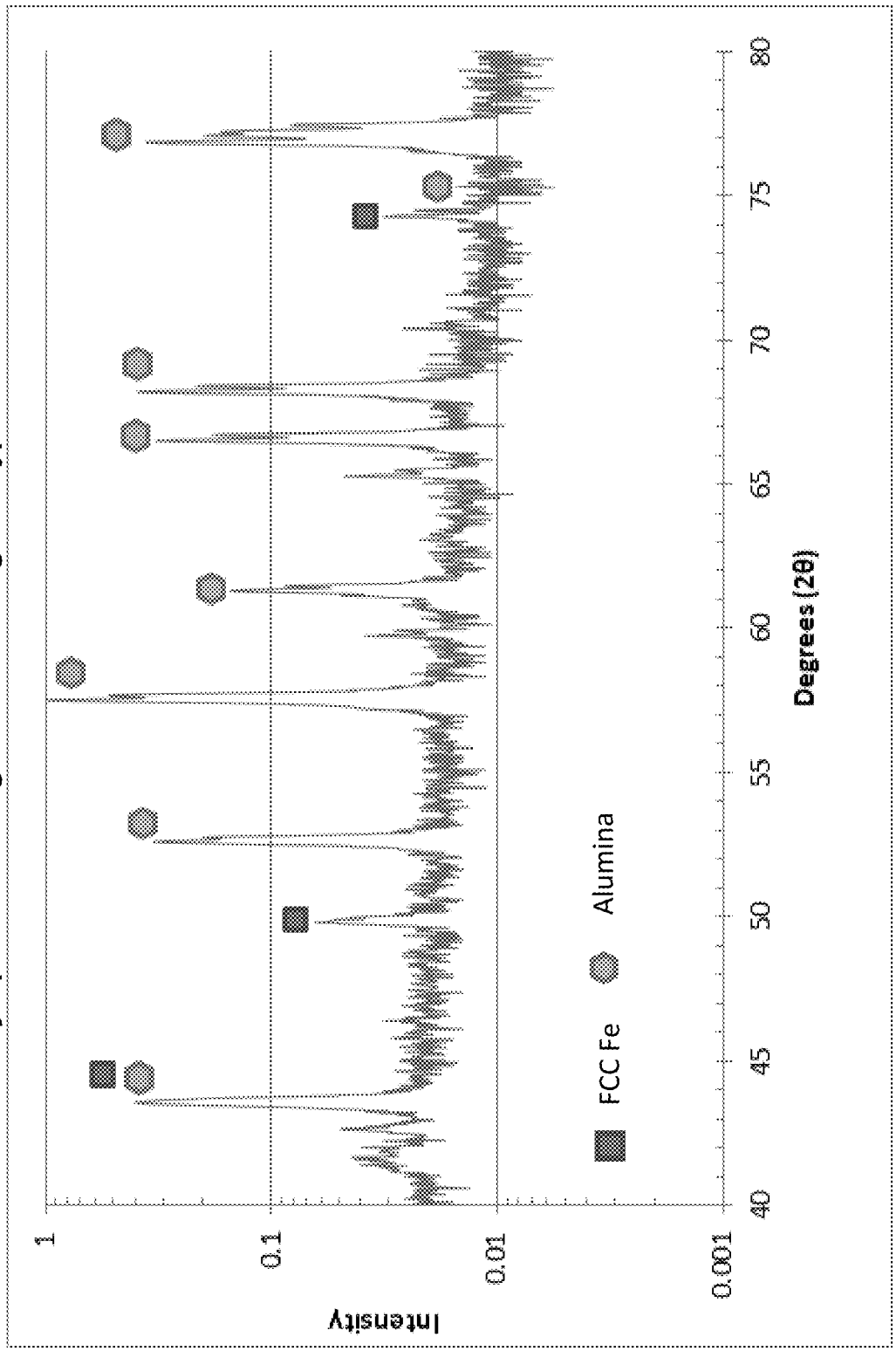
FIG. 23 provides x-ray diffraction data for 10 g/L iron nanoparticles at 25° C., in log scale, in accordance with an embodiment of the present disclosure.

FIG. 22 is an x-ray diffraction pattern of iron nanoparticles produced using 10 g/L iron and 3.3 g/L of Polyphenon-60 green tea polyphenols (Sigma Aldrich) at 25° C. in accordance with an embodiment of the present disclosure. FIG. 23 is an x-ray diffraction pattern (log) for particles produced using 10 g/L iron and 3.3 g/L Polyphenon-60 at 25° C. The nanoparticles in this experiment were centrifuged from solution and washed with ethanol to remove excess ferrous chloride. As can be seen in FIGS. 22 and 23, the x-ray diffraction spectrum does not show any peaks for BCC iron. Instead, the figures illustrate three peaks indicative of FCC iron, at 43.54, 49.80, and 74.26 2θ degrees. The other peaks in the spectrum are likely from aluminum oxide. These peaks include an overlap on the 43.38 and the shoulder on the 74.25 peaks.

Figure 24:
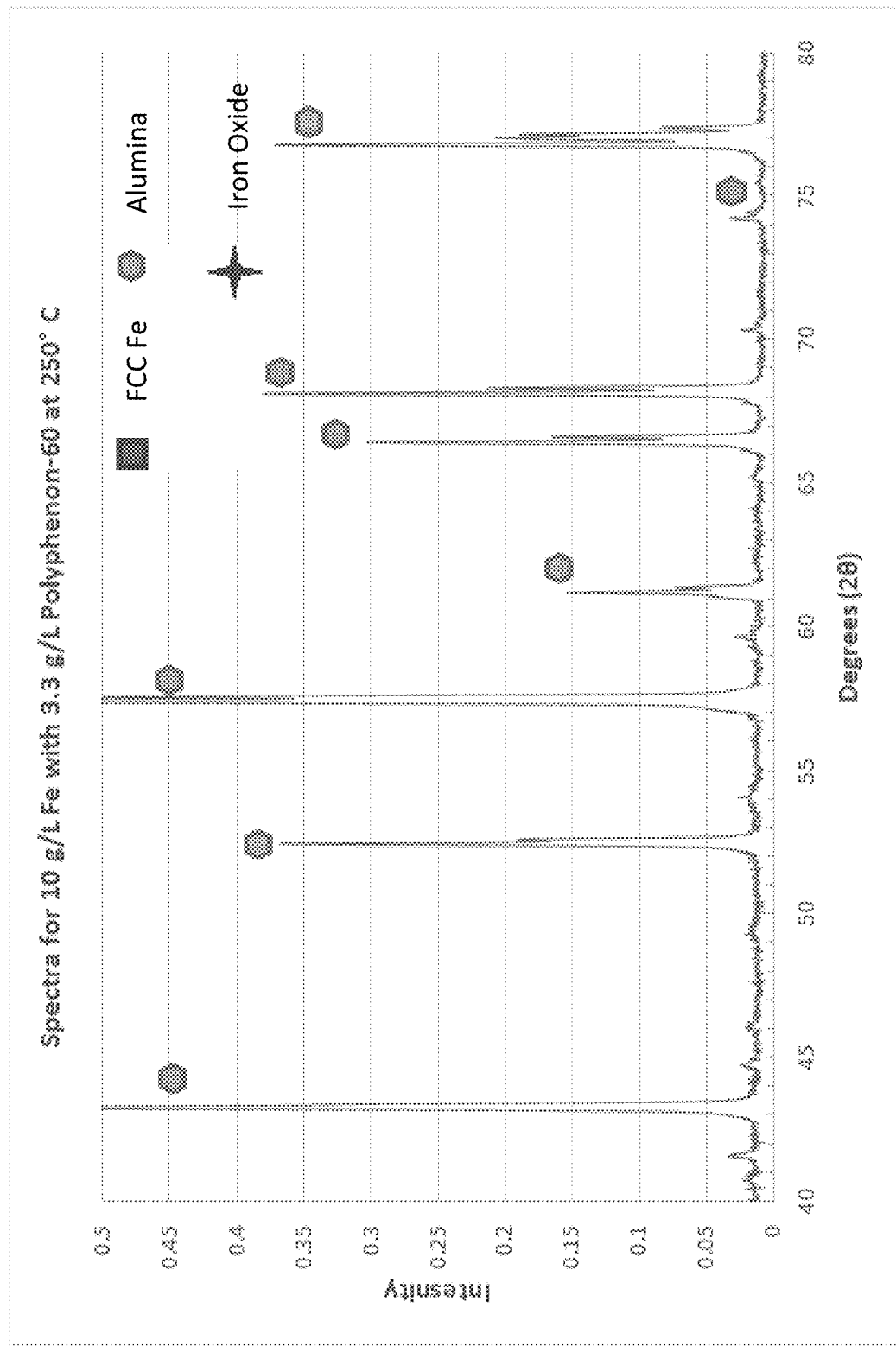
FIG. 24 provides x-ray diffraction data for 10 g/L iron nanoparticles at 250° C. in standard linear scale, in accordance with an embodiment of the present disclosure.
Figure 25:
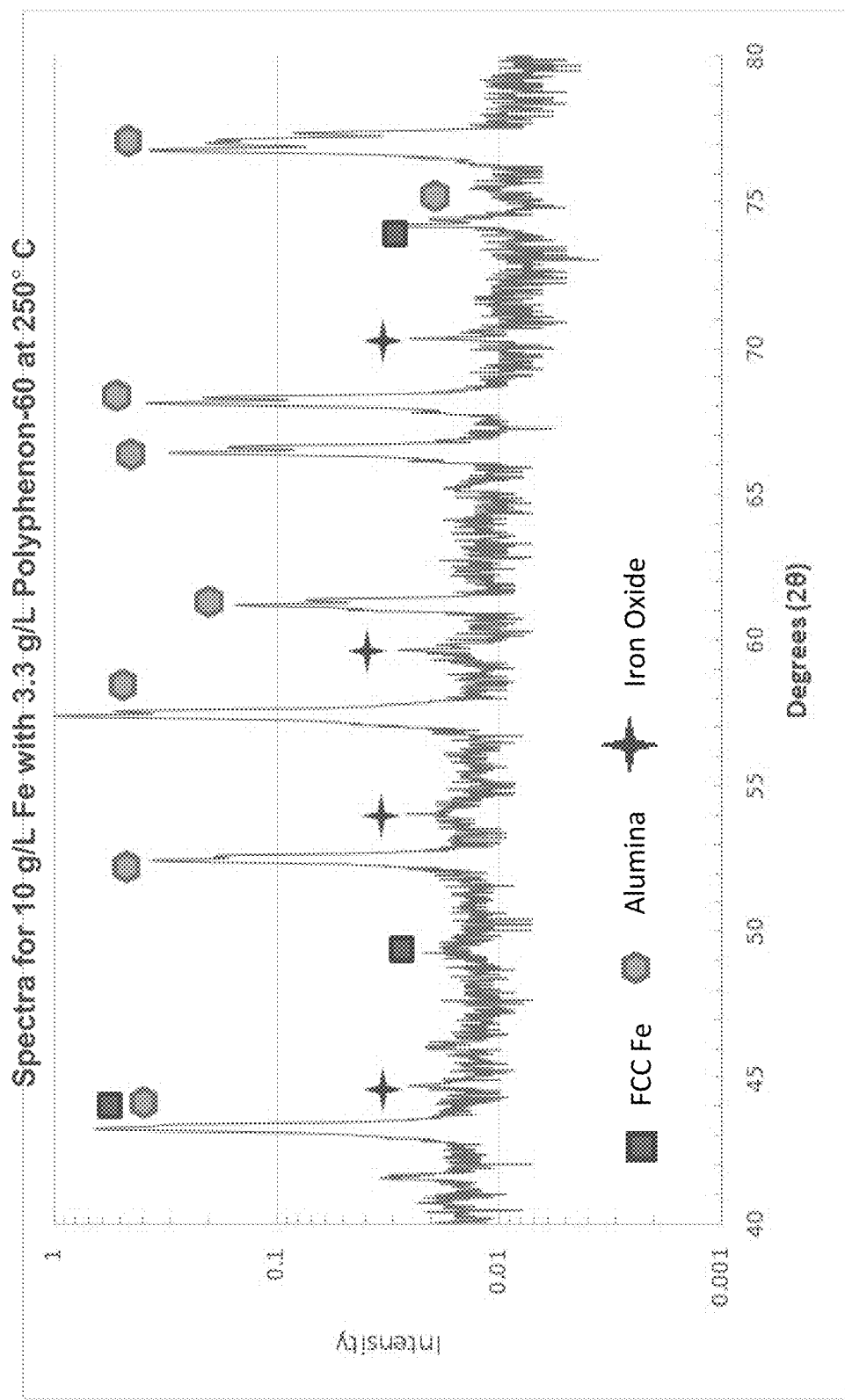
FIG. 25 provides x-ray diffraction data for 10 g/L iron nanoparticles at 250° C. in log scale, in accordance with an embodiment of the present disclosure.

FIG. 24 is an x-ray diffraction pattern of nanoparticles produced from 10 g/L iron and 3.3 g/L of Polyphenon-60, in accordance with an embodiment of the present disclosure. After production, the nanoparticles were baked at 250° C. for fifteen minutes. FIG. 25 is an x-ray diffraction pattern of the same nanoparticles in log scale. During the baking process, the polyphenol oxidized causing apparent oxidation of some of the iron nanoparticles. As can be seen in FIGS. 24 and 25, some iron oxide peaks are evident at 44.70 and 54.19. In addition, there are fewer FCC peaks and several other new peaks not shown in the FIGS. 22 and 23. The new peaks indicate the presence of iron oxide which formed because the polyphenols were no longer capping the iron particles.

Results

The nanoparticles that are produced by the chemical reduction of iron salts with polyphenols, as previously described herein, produced a wide range of nanoparticles, as the characteristics of which are summarized in Table 1, below. The data indicate that as the temperature is increased from 0° C. to 70° C. the nanoparticles become smaller with a slight increase in standard deviation.

TABLE 1

Average diameters, standard deviation and size error of nanoparticle samples

| Sample | Average Diameter (nm) | Standard Deviation (nm) | Error in Diameter (nm) |
|---|---|---|---|
| Hexadecylamine | 6.45 | 1.29 | 0.18 |
| 0.5g/L Fe-Polyphenol 0.94 g/L (1) | 6.07 | 1.59 | 0.22 |
| Bigelow 0° C. | 15.78 | 3.60 | 0.51 |
| Bigelow 25° C. | 15.20 | 3.64 | 0.51 |
| Bigelow 70° C. | 13.20 | 3.72 | 0.53 |
| 0.1 g/L Fe-0.94 g/L Polyphenol | 5.95 | 1.83 | 0.26 |
| 0.5 g/L Fe-0.94 g/L Polyphenol (2) | 5.76 | 1.23 | 0.17 |
| 2.5 g/L Fe-0.94 g/L Polyphenol | 16.27 | 2.83 | 0.40 |
| 0.5 g/L Fe-1.5 g/L Polyphenol | 8.46 | 2.90 | 0.41 |
| 2.5 g/L Fe-1.5 g/L Polyphenol | 7.37 | 1.44 | 0.20 |
| 0.5 g/L Fe-Sodium Borohydride | 4.81 | 0.64 | 0.09 |
| 0.5 g/L Fe 3wt % Cu-Sodium Borohydride | 3.86 | 0.66 | 0.09 |

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize or will be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified, unless clearly indicated to the contrary.

All references, patents and patent applications and publications that are cited or referred to in this application are incorporated in their entirety herein by reference.

What is claimed is:

1. A method of producing carbon nanotubes, the method comprising:
    combining a ferrous or ferric ion with a long chain amine, a thiol, or a polyphenol in a solvent comprising alcohol to produce a suspension;
    reducing the ferrous or ferric ion to zero valence iron;
    initializing nucleation of iron nanoparticles;
    capping the iron nanoparticles with the long chain amine, the thiol, or the polyphenol in the suspension to provide a solution of capped iron nanoparticles; and
    introducing the solution of capped iron nanoparticles into an inert or reducing atmosphere at a temperature of at least 1200° C.

2. The method of claim 1, wherein the alcohol comprises at least one of methanol, ethanol, and butanol.

3. The method of claim 1, wherein the iron nanoparticles have an average diameter of less than or equal to 50 nm.

4. The method of claim 1, further comprising adding copper to the suspension to produce iron nanoparticles comprising copper.

5. The method of claim 4, wherein the iron nanoparticles comprising copper have an average diameter of less than or equal to 15.8 nm.

6. The method of claim 5, wherein the iron nanoparticles have an average diameter of less than or equal to 5.8 nm.

7. The method of claim 5, wherein the iron nanoparticles have an average diameter with a standard deviation of less than or equal to 3.7 nm.

8. The method of claim 1, wherein the suspension comprises iron at a concentration of from 0.1 to 10 g/L.

9. The method of claim 8, wherein the concentration is from 0.5 to 2.5 g/L.

10. The method of claim 1, wherein the suspension comprises the polyphenol.

11. The method of claim 10, wherein the suspension includes the polyphenol at a concentration of less than or equal to 3.3 g/L.

12. The method of claim 11, wherein the polyphenol is selected from epigallocatechin gallate, epicatechin, epigallocatechin, and gallocatechin.

13. A method of producing nanotubes, the method comprising:
    providing a suspension of catalyst nanoparticles in a carrier liquid, the plurality of nanoparticles having an average diameter of less than or equal to 50 nanometers and individual catalyst nanoparticles comprising an elemental iron core coated with a polyphenol; and
    introducing the suspension of catalyst nanoparticles into an inert or reducing atmosphere having a temperature between 1200° C. and 1500° C.

14. The method of claim 13, further comprising removing the polyphenol from the elemental iron core.

15. The method of claim 13, wherein the carrier liquid comprises at least one of ethanol, methanol, butanol, or benzene.

16. The method of claim 13, wherein introducing the suspension to the inert or reducing atmosphere includes nebulizing the suspension to form a spray.

17. The method of claim 16, wherein nebulizing the suspension is performed using one or more gases selected from hydrogen, nitrogen, ammonia, helium, and argon.

18. The method of claim 13, wherein providing the solution of catalyst nanoparticles comprises:
    mixing an iron salt comprising ferrous or ferric iron with a polyphenol in an alcohol;
    reducing the ferrous or ferric iron to zero valence iron;
    initializing nucleation of iron nanoparticles in the alcohol; and
    capping the nanoparticles with the polyphenol to produce a suspension of catalyst nanoparticles in a carrier liquid, the catalyst.

19. The method of claim 18, wherein the iron salt comprises ferrous chloride.

20. The method of claim 18, wherein the polyphenol is selected from epigallocatechin gallate, epicatechin, epigallocatechin, and gallocatechin.

21. The method of claim 18, further comprising adding a sulfur source to the suspension.

22. The method of claim 21, wherein the sulfur source includes at least one of thiophene and carbon disulfide.

23. The method of claim 18, further comprising adding copper to the suspension.

* * * * *